(12) United States Patent
Shibata et al.

(10) Patent No.: US 11,630,253 B2
(45) Date of Patent: *Apr. 18, 2023

(54) LAMINATE, ORGANIC ELECTROLUMINESCENT DEVICE, AND LIQUID CRYSTAL DISPLAY DEVICE

(71) Applicant: FUJIFILM Corporation, Tokyo (JP)

(72) Inventors: Naoya Shibata, Kanagawa (JP); Mayumi Nojiri, Kanagawa (JP); Ayako Muramatsu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 226 days.

This patent is subject to a terminal disclaimer.

(21) Appl. No.: 17/190,106

(22) Filed: Mar. 2, 2021

(65) Prior Publication Data

US 2021/0181396 A1 Jun. 17, 2021

Related U.S. Application Data

(63) Continuation of application No. PCT/JP2019/034742, filed on Sep. 4, 2019.

(30) Foreign Application Priority Data

Sep. 4, 2018 (JP) .............................. JP2018-165295

(51) Int. Cl.
*G02B 5/30* (2006.01)
*G02B 1/14* (2015.01)
(Continued)

(52) U.S. Cl.
CPC ............ *G02B 5/3016* (2013.01); *C09K 19/04* (2013.01); *G02B 1/08* (2013.01); *G02B 1/116* (2013.01);
(Continued)

(58) Field of Classification Search
CPC combination set(s) only.
See application file for complete search history.

(56) References Cited

U.S. PATENT DOCUMENTS

2009/0189120 A1 7/2009 Takeuchi
2010/0045901 A1* 2/2010 Uehira ................. C07D 277/64
349/193

(Continued)

FOREIGN PATENT DOCUMENTS

CN 101487912 A 7/2009
CN 104339796 A 2/2015
(Continued)

OTHER PUBLICATIONS

Office Action, issued by the Japanese Patent Office dated Mar. 8, 2022, in connection with Japanese Patent Application No. 2020-541262.
(Continued)

*Primary Examiner* — Sophie Hon
(74) *Attorney, Agent, or Firm* — Edwards Neils LLC; Jean C. Edwards, Esq.

(57) ABSTRACT

The present invention provides: a laminate which has a polarizer and an optically anisotropic layer and has excellent thermal durability; and an organic electroluminescent device and a liquid crystal display device, which include the laminate. The laminate according to the embodiment of the present invention is a laminate having two substrates, and a polarizing plate disposed between the two substrates, in which the polarizing plate has an optically anisotropic layer and a polarizer, the optically anisotropic layer is formed of a composition containing a polymerizable liquid crystal compound represented by Formula (I), the polarizer contains a polyvinyl alcohol-based resin, and a moisture permeability of the substrate is $10^{-3}$ g/m²·day or less.

(Continued)

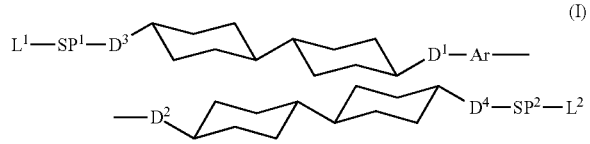

(I)

14 Claims, 1 Drawing Sheet

(51) Int. Cl.
    *G02F 1/13363* (2006.01)
    *C09K 19/04* (2006.01)
    *G02B 1/08* (2006.01)
    *G02B 1/116* (2015.01)
    *H01L 51/52* (2006.01)
    *G02F 1/1335* (2006.01)

(52) U.S. Cl.
    CPC .............. *G02B 1/14* (2015.01); *G02B 5/305* (2013.01); *G02B 5/3083* (2013.01); *G02F 1/133541* (2021.01); *G02F 1/133638* (2021.01); *H01L 51/5293* (2013.01); *C09K 2019/0448* (2013.01); *C09K 2323/035* (2020.08); *G02F 2201/50* (2013.01); *G02F 2202/022* (2013.01)

(56) References Cited

U.S. PATENT DOCUMENTS

| | | | |
|---|---|---|---|
| 2011/0095677 | A1 | 4/2011 | Yoshizawa et al. |
| 2015/0041051 | A1 | 2/2015 | Kobayashi |
| 2015/0175564 | A1 | 6/2015 | Sakamoto et al. |
| 2016/0070383 | A1 | 3/2016 | Toyoshima et al. |
| 2016/0131809 | A1* | 5/2016 | Takeda ................ G02F 1/13363 349/194 |
| 2017/0369783 | A1* | 12/2017 | Horiguchi ............ C07D 307/66 |
| 2018/0327668 | A1* | 11/2018 | Horiguchi .............. C09K 19/54 |
| 2020/0140758 | A1 | 5/2020 | Shimamura et al. |
| 2020/0140759 | A1 | 5/2020 | Shimamura et al. |
| 2020/0392408 | A1 | 12/2020 | Shibata et al. |

FOREIGN PATENT DOCUMENTS

| | | | | |
|---|---|---|---|---|
| CN | 112639554 | B | * 10/2022 | ............. C09K 19/04 |
| JP | 2008-273925 | A | 11/2008 | |
| JP | 2009-179563 | A | 8/2009 | |
| JP | 2011-207765 | A | 10/2011 | |
| JP | 2018-002756 | A | 1/2018 | |
| JP | 7145955 | B2 | * 10/2022 | ............. C09K 19/04 |
| WO | 2009/022380 | A1 | 2/2009 | |
| WO | 2014/010325 | A1 | 1/2014 | |
| WO | 2014/065001 | A1 | 5/2014 | |
| WO | 2014/167815 | A1 | 10/2014 | |
| WO | 2019/017444 | A1 | 1/2019 | |
| WO | 2019/017445 | A1 | 1/2019 | |
| WO | 2019/160029 | A1 | 8/2019 | |
| WO | 2019/167926 | A1 | 9/2019 | |

OTHER PUBLICATIONS

Office Action, issued by the State Intellectual Property Office of China dated Apr. 14, 2022, in connection with Chinese Patent Application No. 201980057518.X.

International Search Report issued in PCT/JP2019/034742 dated Nov. 12, 2019.

Written Opinion issued in PCT/JP2019/034742 dated Nov. 12, 2019.

International Preliminary Report on Patentability completed by WIPO on Mar. 9, 2021 in connection with International Patent Application No. PCT/JP2019/034742.

* cited by examiner

LAMINATE, ORGANIC ELECTROLUMINESCENT DEVICE, AND LIQUID CRYSTAL DISPLAY DEVICE

CROSS-REFERENCE TO RELATED APPLICATIONS

This application is a Continuation of PCT International Application No. PCT/JP2019/034742 filed on Sep. 4, 2019, which was published under PCT Article 21(2) in Japanese, and which claims priority under 35 U.S.C. § 119(a) to Japanese Patent Application No. 2018-165295 filed on Sep. 4, 2018. The above applications are hereby expressly incorporated by reference, in their entirety, into the present application.

BACKGROUND OF THE INVENTION

1. Field of the Invention

The present invention relates to a laminate, an organic electroluminescent device, and a liquid crystal display device.

2. Description of the Related Art

In the related art, a polarizing plate having an optically anisotropic layer and a polarizer has been used for an organic electroluminescent device, a liquid crystal display device, or the like for the purpose of optical compensation, antireflection, or the like.

In recent years, development of a polarizing plate (so-called broadband polarizing plate) which can provide the same effects to white light which is a composite wave having light rays in a visible light range coexisting therein, in correspondence to light rays at all wavelengths, has been in progress, and in particular, due to a demand for reduction in a thickness of a device to which a polarizing plate is applied, reduction in a thickness of an optically anisotropic layer included in the polarizing plate has also been demanded.

In response to the above demands, WO2014/010325A and JP2011-207765A each propose use of a polymerizable liquid crystal compound having reciprocal wavelength dispersibility as a polymerizable compound which is used for forming an optically anisotropic layer.

SUMMARY OF THE INVENTION

However, it has been found that in a case where a polarizing plate having an optically anisotropic layer which is formed of the polymerizable liquid crystal (polymerizable compound) having reciprocal wavelength dispersibility described in WO2014/010325A and JP2011-207765A is manufactured, the polarizing plate is interposed between substrates (for example, glass substrates) with a low moisture permeability from both sides in accordance with a practical mode (for example, a circularly polarizing plate for the purpose of antireflection of an organic electroluminescence-type smartphone), and the obtained laminate is exposed for a long period of time under the condition of a high temperature, reddish unevenness occurs in an in-plane central part of the laminate. As a result of the analysis, it has been clarified that an in-plane retardation (Re) significantly varies in a reddish region, thereby causing a change in a tint. Therefore, development of a laminate which has a polarizer and an optically anisotropic layer and in which a change in a retardation is suppressed even in a case of being exposed to a high temperature for a long period of time was desired. Hereinafter, suppressing a change in an in-plane retardation in a case where a laminate is exposed to a high temperature will be expressed as excellent thermal durability.

Accordingly, an object of the present invention is to provide a laminate which has a polarizer and an optically anisotropic layer and has excellent thermal durability.

Moreover, another object of the present invention is to provide an organic electroluminescent device and a liquid crystal display device, which include the laminate.

As a result of intensive studies on the objects, the present inventors have found that the objects can be accomplished by the following configurations.

(1) A laminate comprising: two substrates; and a polarizing plate disposed between the two substrates,
in which the polarizing plate has a polarizer and an optically anisotropic layer,
the polarizer contains a polyvinyl alcohol-based resin,
the optically anisotropic layer is formed of a composition containing a polymerizable liquid crystal compound represented by Formula (I), and
a moisture permeability of the substrate is $10^{-3}$ g/m$^2$·day or less.

(2) The laminate according to (1), in which a thickness of the polarizer is less than 10 µm.

(3) The laminate according to (1) or (2), further comprising a polarizer protective film provided between the polarizer and the optically anisotropic layer,
in which a moisture permeability of the polarizer protective film is 50 g/m$^2$·day or less.

(4) The laminate according to (3), in which the polarizer protective film contains a norbornene-based resin.

(5) The laminate according to any one of (1) to (4), in which Re(450) which is an in-plane retardation of the optically anisotropic layer at a wavelength of 450 nm, Re(550) which is an in-plane retardation of the optically anisotropic layer at a wavelength of 550 nm, and Re(650) which is an in-plane retardation of the optically anisotropic layer at a wavelength of 650 nm satisfy a relationship of Re(450)≤Re(550)≤Re(650).

(6) The laminate according to any one of (1) to (5), in which the optically anisotropic layer is a positive A-plate.

(7) The laminate according to any one of (1) to (6), in which the optically anisotropic layer is a λ/4 plate.

(8) An organic electroluminescent device comprising the laminate according to any one of (1) to (7).

(9) A liquid crystal display device comprising the laminate according to any one of (1) to (7).

According to the present invention, it is possible to provide a laminate which has a polarizer and an optically anisotropic layer and has excellent thermal durability.

Moreover, according to the present invention, it is possible to provide an organic electroluminescent device and a liquid crystal display device, which include the laminate.

DESCRIPTION OF THE PREFERRED EMBODIMENTS

Figure 1:
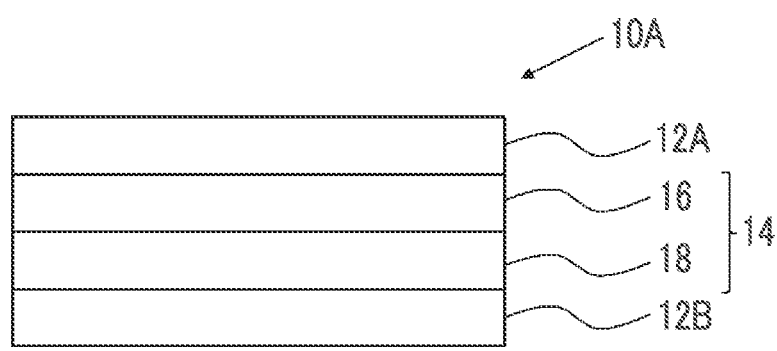
FIG. 1 is a schematic cross-sectional view showing an example of a laminate according to the embodiment of the present invention.

Hereinafter, a laminate, an organic electroluminescent device, and a liquid crystal display device according to an embodiment of the present invention will be described.

In addition, in the present specification, a numerical range expressed using "to" means a range that includes the preceding and succeeding numerical values of "to" as the lower limit value and the upper limit value, respectively.

Moreover, "orthogonal" and "parallel" with respect to angles mean a range of a strict angle ±10°, and "same" and "different" with respect to the angles can be determined based on whether or not the difference is less than 5°.

Furthermore, in the present specification, "visible light" means light at 380 to 780 nm. Moreover, in the present specification, a measurement wavelength is 550 nm unless otherwise specified with respect to the measurement wavelength.

Next, terms used in the present specification will be described.

<Slow Axis>

In the present specification, a "slow axis" means a direction in which the in-plane refractive index is maximum. Moreover, the slow axis of the optically anisotropic layer is intended to mean a slow axis of the entire optically anisotropic layer.

<Re($\lambda$) and Rth($\lambda$)>

An in-plane retardation (Re(k)) and a thickness-direction retardation (Rth($\lambda$)) refer to values measured using AxoScan OPMF-1 (manufactured by Opto Science, Inc.) with use of light having a measurement wavelength.

Specifically, by inputting an average refractive index (($n_x+n_y+n_z$)/3) and a film thickness (d ($\mu$m)) to AxoScan OPMF-1, it is possible to calculate:

Slow axis direction(°)

$Re(\lambda)=R0(\lambda)$ $Rth(\lambda)=((n_x+n_y)/2-n_z)\times d$.

In addition, R0($\lambda$) is expressed in a numerical value calculated with AxoScan OPMF-1, and means Re($\lambda$).

In addition, in the present specification, an A-plate is defined as follows.

The A-plate has two types, that is, a positive A-plate and a negative A-plate, and in a case where a refractive index in a slow axis direction (direction in which the in-plane refractive index is maximum) in a film plane is defined as nx, a refractive index in a direction orthogonal to an in-plane slow axis in a plane is defined as ny, and a refractive index in the thickness direction is defined as nz, the positive A-plate satisfies a relationship of Expression (A1) and the negative A-plate satisfies a relationship of Expression (A2). Moreover, the positive A-plate has Rth of a positive value and the negative A-plate has Rth of a negative value.

$nx>ny\approx nz$      Expression (A1)

$ny<nx\approx nz$      Expression (A2)

Furthermore, the symbol "$\approx$" encompasses not only a case where the both are completely the same as each other but also a case where the both are substantially the same as each other. For example, "being substantially the same" indicates that a case where (ny−nz)×d (provided that d is a thickness of a film) is −10 to 10 nm and preferably −5 to 5 nm is also included in "ny$\approx$nz", and a case where (nx−nz)×d is −10 to 10 nm and preferably −5 to 5 nm is also included in "nx$\approx$nz".

A C-plate has two types, that is, a positive C-plate and a negative C-plate, the positive C-plate satisfies a relationship of Expression (C1), and the negative C-plate satisfies a relationship of Expression (C2). Moreover, the positive C-plate has Rth of a negative value and the negative C-plate has Rth of a positive value.

$nz>nx\approx ny$      Expression (C1)

$nz<nx\approx ny$      Expression (C2)

Furthermore, the symbol "$\approx$" encompasses not only a case where the both are completely the same as each other but also a case where the both are substantially the same as each other. For example, "being substantially the same" indicates that a case where (nx−ny)×(provided that d is a thickness of a film) is 0 to 10 nm and preferably 0 to 5 nm is also included in "nx$\approx$ny".

A feature of the present invention is that the optically anisotropic layer interposed between the two substrates in the laminate is formed of a predetermined liquid crystal compound.

As a result of studies on a cause of the above-mentioned reddish unevenness, the present inventors have found that moisture derived from a polarizer containing a polyvinyl alcohol-based resin affects the reddish unevenness. That is, in a case where a laminate having a polarizer, which contains a polyvinyl alcohol-based resin and is interposed between two substrates with a low moisture permeability, is subjected to a heating treatment, due to the low moisture permeability of the substrates, moisture contained in the polarizer cannot escape to the outside of the substrate. Therefore, the moisture easily moves to an optically anisotropic layer interposed between the two substrates, together with the polarizer. In the liquid crystal compound in the related art, hydrolysis was caused by influence of moisture, and as a result, an in-plane retardation was changed. On the other hand, in the present invention, it has been found that in a case where a predetermined liquid crystal compound is used, the laminate is less likely to be affected by the moisture derived from the polarizer, and as a result, thermal durability of the laminate is excellent.

FIG. 1 shows a schematic cross-sectional view of a laminate according to the embodiment of the present invention. A laminate 10A has a first substrate 12A, a polarizing plate 14, and a second substrate 12B in this order. That is, the polarizing plate 14 is disposed between the first substrate 12A and the second substrate 12B. The polarizing plate 14 has a polarizer 16 and an optically anisotropic layer 18.

Hereinafter, each member will be described in detail.

<Substrate (First Substrate 12A and Second Substrate 12B)>

The laminate has two substrates. In FIG. 1, the two substrates correspond to the first substrate 12A and the second substrate 12B.

A moisture permeability of the substrate is $10^{-3}$ g/m$^2$·day or less. Among them, from the viewpoint of durability of an organic electroluminescent device and a liquid crystal display device, to which the laminate is applied, $10^{-4}$ g/m$^2$·day or less is preferable and $10^{-5}$ g/m$^2$·day or less is more preferable. The lower limit is not particularly limited, but is $10^{-10}$ g/m$^2$·day or greater in many cases.

The method for measuring the moisture permeability of the substrate is as follows. The measurement is performed using a water vapor transmission measuring device (AQUA-TRAN 2 (registered trademark) manufactured by MOCON, INC.) under the conditions of a measuring temperature of 40° C. and a relative humidity of 90%.

A material forming the substrate is not particularly limited, and may be an inorganic substance or an organic substance.

The substrate is not particularly limited as long as the substrate has a moisture permeability lower than the regulation, but examples thereof include a glass substrate and a gas barrier film. More specifically, examples thereof include sealing glass used for an organic electroluminescent device, a glass substrate such as glass for a liquid crystal cell and surface cover glass, and a gas barrier film such as a high barrier film and a barrier film used for an organic electroluminescent device.

The substrate may have a single-layered structure or a multi-layer structure.

The substrate is preferably transparent. That is, the substrate is preferably a so-called transparent substrate.

Furthermore, in the present specification, "transparent" indicates that a transmittance of visible light is 60% or greater, preferably 80% or greater, and more preferably 90% or greater. The upper limit is not particularly limited, but is less than 100% in many cases.

A thickness of the substrate is not particularly limited, but is preferably 800 μm or less and more preferably 100 μm or less from the viewpoint of reduction in the thickness. The lower limit is not particularly limited, but is preferably 10 μm or greater.

<Polarizer>

The laminate has the polarizer. The polarizer is a so-called linear polarizer having a function of converting light into specific linearly polarized light.

The polarizer contains a polyvinyl alcohol-based resin.

The polyvinyl alcohol-based resin is a resin containing a repeating unit represented by —$CH_2$—CHOH—, and examples thereof include polyvinyl alcohol and an ethylene-vinyl alcohol copolymer.

The polyvinyl alcohol-based resin is obtained, for example, by saponifying a polyvinyl acetate-based resin. Examples of the polyvinyl acetate-based resin include copolymers with other monomers copolymerizable with vinyl acetate, in addition to polyvinyl acetate which is a homopolymer of vinyl acetate.

Examples of the other monomers copolymerizable with vinyl acetate include unsaturated carboxylic acids, olefins, vinyl ethers, unsaturated sulfonic acids, and acrylamides having an ammonium group.

A saponification degree of the polyvinyl alcohol-based resin is not particularly limited, but is preferably 85% to 100% by mole and more preferably 95.0% to 99.95% by mole. The saponification degree can be determined according to JIS K 6726-1994.

An average degree of polymerization of the polyvinyl alcohol-based resin is not particularly limited, but is preferably 100 to 10,000 and more preferably 1,500 to 8,000. Similar to the saponification degree, the average degree of polymerization can be determined according to JIS K 6726-1994.

A content of the polyvinyl alcohol-based resin in the polarizer is not particularly limited, but it is preferable that the polyvinyl alcohol-based resin is contained as a main component in the polarizer. The main component means that the content of the polyvinyl alcohol-based resin is 50% by mass or more with respect to the total mass of the polarizer. The content of the polyvinyl alcohol-based resin is preferably 90% by mass or more with respect to the total mass of the polarizer. The upper limit is not particularly limited, but is 99.9% by mass or less in many cases.

The polarizer preferably further contains a dichroic substance. Examples of the dichroic substance include iodine and an organic dye (dichroic organic dye). That is, it is preferable that the polarizer contains polyvinyl alcohol as a main component and also contains a dichroic substance.

A method for manufacturing the polarizer is not particularly limited, known methods can be mentioned, and examples thereof include a method for adsorbing a dichroic substance to a substrate containing polyvinyl alcohol and stretching the resultant.

A thickness of the polarizer is not particularly limited, but is 20 μm or less in many cases, and from the viewpoint that the thermal durability of the laminate is superior (hereinafter, also simply referred to as a "viewpoint that the effect of the present invention is superior"), is more preferably less than 10 μm and particularly preferably 5 μm or less. The lower limit is not particularly limited, but is 2 μm or greater in many cases.

<Optically Anisotropic Layer>

The laminate has an optically anisotropic layer. The optically anisotropic layer is a layer formed of a composition containing a polymerizable liquid crystal compound represented by Formula (I).

In the following, first, components in the composition used for forming the optically anisotropic layer will be described in detail, and then a manufacturing method and characteristics of the optically anisotropic layer will be described in detail.

(Polymerizable Liquid Crystal Compound Represented by Formula (I))

The composition contains a polymerizable liquid crystal compound represented by Formula (I). The polymerizable liquid crystal compound represented by Formula (I) is a compound exhibiting liquid crystallinity.

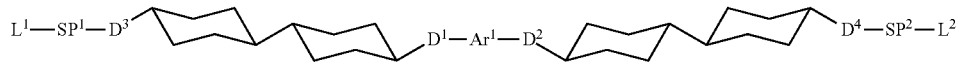

In Formula (I), $D^1$, $D^2$, $D^3$, and $D^4$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Moreover, in Formula (I), $SP^1$ and $SP^2$ each independently represent a single bond, a linear or branched alkylene group having 1 to 12 carbon atoms, or a divalent linking group in which one or more —$CH_2$—'s constituting a linear or branched alkylene group having 1 to 12 carbon atoms are substituted with —O—, —S—, —NH—, —N(Q)-, or —CO—, and Q represents a substituent.

Furthermore, in Formula (I), $L^1$ and $L^2$ each independently represent a monovalent organic group, and at least one of $L^1$ or $L^2$ represents a polymerizable group, provided that in a case where Ar is a group represented by Formula (Ar-3), at least one of $L^1$ or $L^2$, or $L^3$ or $L^4$ in Formula (Ar-3) represents a polymerizable group.

Examples of the linear or branched alkylene group which has 1 to 12 carbon atoms and is represented by $SP^1$ or $SP^2$ in Formula (I) include a methylene group, an ethylene group, a propylene group, a butylene group, a pentylene group, a hexylene group, a methylhexylene group, and a heptylene group. Moreover, as described above, $SP^1$ and $SP^2$ may each be a divalent linking group in which one or more —$CH_2$—'s constituting a linear or branched alkylene group having 1 to 12 carbon atoms are substituted with —O—, —S—, —NH—, —N(Q)-, or —CO—, and examples of the substituent represented by Q include the same substituents as the substituents that $Y^1$ in Formula (Ar-1) may have.

Examples of the monovalent organic group represented by $L^1$ or $L^2$ in Formula (I) include an alkyl group, an aryl group, and a heteroaryl group.

The alkyl group may be linear, branched, or cyclic, but is preferably linear. The number of carbon atoms in the alkyl group is preferably 1 to 30, more preferably 1 to 20, and still more preferably 1 to 10.

The aryl group may be monocyclic or polycyclic, but is preferably monocyclic. The number of carbon atoms in the aryl group is preferably 6 to 25 and more preferably 6 to 10.

The heteroaryl group may be monocyclic or polycyclic. The number of heteroatoms constituting the heteroaryl group is preferably 1 to 3. The heteroatom constituting the heteroaryl group is preferably a nitrogen atom, a sulfur atom, or an oxygen atom. The number of carbon atoms in the heteroaryl group is preferably 6 to 18 and more preferably 6 to 12.

Furthermore, the alkyl group, aryl group, and heteroaryl group may be unsubstituted or may have a substituent. Examples of the substituent include the same substituents as the substituents that $Y^1$ in Formula (Ar-1) may have.

The polymerizable group represented by at least one of $L^1$ or $L^2$ in Formula (I) is not particularly limited, but is preferably a radically polymerizable group or a cationically polymerizable group.

As a radically polymerizable group, commonly known radically polymerizable groups can be used, and an acryloyl group or a methacryloyl group is preferable. In this case, it is known that the acryloyl group generally has a high polymerization rate, from the viewpoint of improvement in productivity, the acryloyl group is preferable, but the methacryloyl group can also be similarly used as the polymerizable group.

As a cationically polymerizable group, commonly known cationically polymerizable groups can be used, and examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is more preferable.

Particularly preferred examples of the polymerizable group include the following groups.

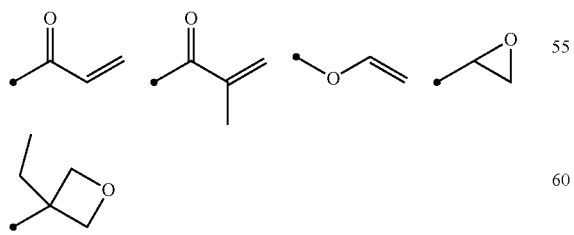

From the viewpoint that the effect of the present invention is superior, both $L^1$ and $L^2$ in Formula (I) are preferably a polymerizable group and more preferably an acryloyl group or a methacryloyl group.

Meanwhile, Ar in Formula (I) represents any one aromatic ring selected from the group consisting of groups represented by Formulae (Ar-1) to (Ar-7). Moreover, * in Formulae (Ar-1) to (Ar-7) represents a bonding position to $D^1$ or $D^2$ in Formula (I).

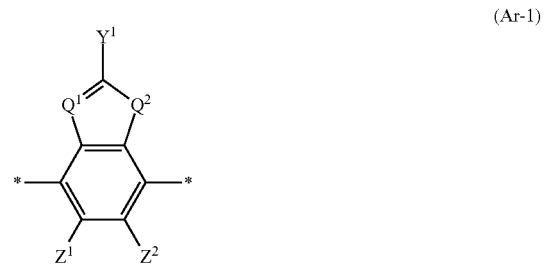
(Ar-1)

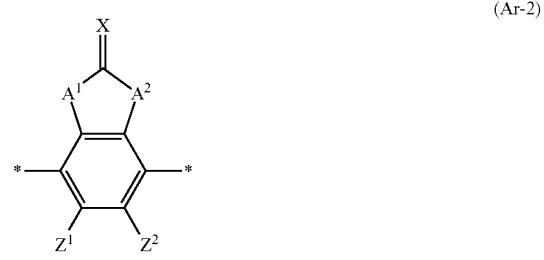
(Ar-2)

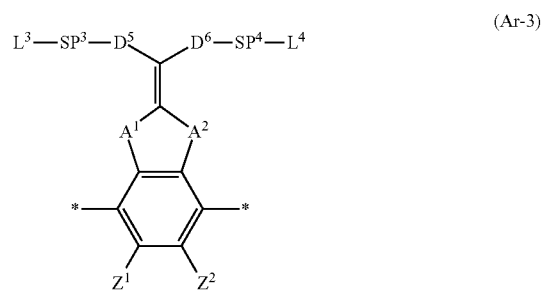
(Ar-3)

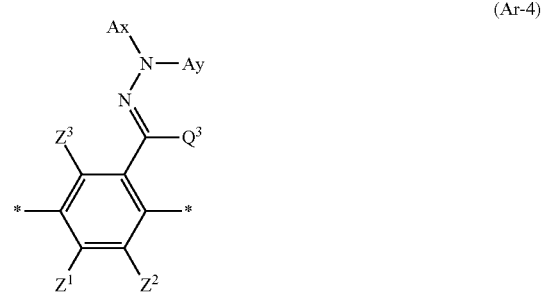
(Ar-4)

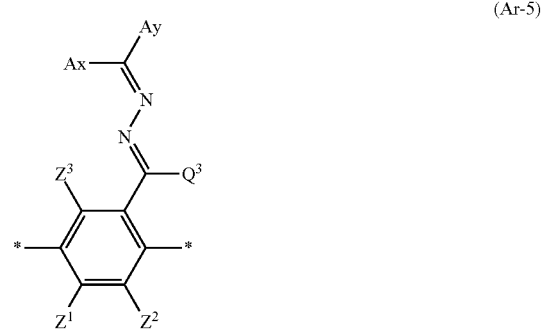
(Ar-5)

-continued

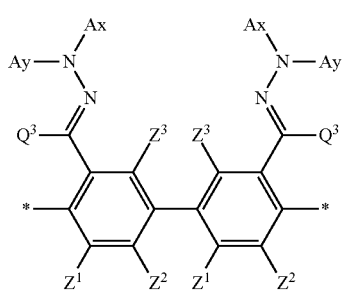

(Ar-6)

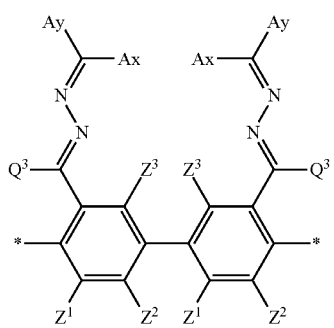

(Ar-7)

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, which may have a substituent.

Examples of the alkyl group which has 1 to 6 carbon atoms and is represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group which has 6 to 12 carbon atoms and is represented by $Y^1$ include aryl groups such as a phenyl group, a 2,6-diethylphenyl group, and a naphthyl group.

Examples of the aromatic heterocyclic group which has 3 to 12 carbon atoms and is represented by $Y^1$ include heteroaryl groups such as a thienyl group, a thiazolyl group, a furyl group, and a pyridyl group.

Moreover, examples of the substituent that $Y^1$ may have include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, a cyclohexyl group, and the like) is more preferable, an alkyl group having 1 to 4 carbon atoms is still more preferable, and a methyl group or an ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, a methoxyethoxy group, and the like) is more preferable, an alkoxy group having 1 to 4 carbon atoms is still more preferable, and a methoxy group or an ethoxy group is particularly preferable.

Examples of the halogen atom include a fluorine atom, a chlorine atom, a bromine atom, and an iodine atom, and among them, a fluorine atom or a chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, and $R^6$ to $R^9$ each independently represent a hydrogen atom or an alkyl group having 1 to 6 carbon atoms, and $Z^1$ and $Z^2$ may be bonded to each other to form an aromatic ring. In particular, at least one of $Z^1$ or $Z^2$ preferably represents a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, and more preferably represents a monovalent aliphatic hydrocarbon group having 1 to 20 carbon atoms.

As the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a tert-butyl group, or a 1,1-dimethyl-3,3-dimethylbutyl group is still more preferable, and a methyl group, an ethyl group, or a tert-butyl group is particularly preferable.

Examples of the monovalent alicyclic hydrocarbon group having 3 to 20 carbon atoms include: a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly, a phenyl group) is preferable.

Examples of the halogen atom include a fluorine atom, a chlorine atom, a bromine atom, and an iodine atom, and a fluorine atom, a chlorine atom, or a bromine atom is preferable.

Meanwhile, examples of the alkyl groups which have 1 to 6 carbon atoms and are represented by $R^6$ to $R^9$ include a methyl group, an ethyl group, a propyl group, an isopropyl group, an n-butyl group, an isobutyl group, a sec-butyl group, a tert-butyl group, an n-pentyl group, and an n-hexyl group.

In Formulae (Ar-2) and (Ar-3), $A^1$ and $A^2$ each independently represent a group selected from the group consisting of —O—, —N($R^{10}$)—, —S—, and —CO—, and $R^{10}$ represents a hydrogen atom or a substituent.

Examples of the substituent represented by $R^{19}$ include the same substituents as the substituents that $Y^1$ in Formula (Ar-1) may have.

In Formula (Ar-2), X represents a non-metallic atom of Group 14 to Group 16, to which a hydrogen atom or a substituent may be bonded.

Moreover, examples of the non-metallic atom which belongs to Group 14 to Group 16 and is represented by X include an oxygen atom, a sulfur atom, a nitrogen atom having a substituent, and a carbon atom having a substituent, and examples of the substituent include an alkyl group, an alkoxy group, an alkyl-substituted alkoxy group, a cyclic alkyl group, an aryl group (for example, a phenyl group, a naphthyl group, and the like), a cyano group, an amino group, a nitro group, an alkylcarbonyl group, a sulfo group, and a hydroxyl group.

In Formula (Ar-3), $D^5$ and $D^6$ each independently represent a single bond, or a divalent linking group consisting of —CO—, —O—, —S—, —C(=S)—, —$CR^{1a}R^{2a}$—, —$CR^{3a}$=$CR^{4a}$—, —$NR^{5a}$—, or a combination of two or more thereof, and $R^{1a}$ to $R^{5a}$ each independently represent a hydrogen atom, a fluorine atom, or an alkyl group having 1 to 4 carbon atoms.

Here, examples of the divalent linking group include —CO—, —O—, —CO—O—, —C(=S)O—, —$CR^{1b}R^{2b}$—, —$CR^{1b}R^{2b}$—$CR^{1b}R^{2b}$—, —O—$CR^{1b}R^{2b}$—, —$CR^{1b}R^{2b}$—O—$CR^{1b}R^{2b}$—, —CO—O—$CR^{1b}R^{2b}$—, —O—CO—$CR^{1b}R^{2b}$—, —$CR^{1b}R^{2b}$—CO—O—$CR^{1b}R^{2b}$—, —O—CO—$CR^{1b}R^{2b}$—, —$CR^{1b}R^{2b}$—CO—O—$CR^{1b}R^{2b}$—, —$NR^{3b}$—$CR^{1b}R^{2b}$—, and —CO—$NR^{3b}$—. $R^{1b}$, $R^{2b}$, and $R^{3b}$ each independently represent a hydrogen atom, a fluorine atom, or an alkyl group having 1 to 4 carbon atoms.

In Formula (Ar-3), $SP^3$ and $SP^4$ each independently represent a single bond, a linear or branched alkylene group having 1 to 12 carbon atoms, or a divalent linking group in which one or more —$CH_2$—'s constituting a linear or branched alkylene group having 1 to 12 carbon atoms are substituted with —O—, —S—, —NH—, —N(Q)-, or —CO—, and Q represents a substituent. Examples of the substituent include the same substituents as the substituents that $Y^1$ in Formula (Ar-1) may have.

Here, as the linear or branched alkylene group having 1 to 12 carbon atoms, a methylene group, an ethylene group, a propylene group, a butylene group, a pentylene group, a hexylene group, a methylhexylene group, and a heptylene group are preferable.

In Formula (Ar-3), $L^3$ and $L^4$ each independently represent a monovalent organic group, and at least one of $L^3$ or $L^4$, or $L^1$ or $L^2$ in Formula (I) represents a polymerizable group.

Examples of the monovalent organic group include the same groups as those described for $L^1$ and $L^2$ in Formula (I).

Moreover, examples of the polymerizable group include the same groups as those described for $L^1$ and $L^2$ in Formula (I).

In Formulae (Ar-4) to (Ar-7), Ax represents an organic group which has 2 to 30 carbon atoms and has at least one aromatic ring selected from the group consisting of an aromatic hydrocarbon ring and an aromatic heterocyclic ring.

Moreover, in Formulae (Ar-4) to (Ar-7), Ay represents a hydrogen atom, an alkyl group which has 1 to 12 carbon atoms and may have a substituent, or an organic group which has 2 to 30 carbon atoms and has at least one aromatic ring selected from the group consisting of an aromatic hydrocarbon ring and an aromatic heterocyclic ring.

Here, the aromatic rings in Ax and Ay may each have a substituent, and Ax and Ay may be bonded to each other to form a ring.

$Q^3$ represents a hydrogen atom or an alkyl group which has 1 to 6 carbon atoms and may have a substituent.

Examples of Ax and Ay include those described in paragraphs [0039] to [0095] of WO2014/010325A.

Examples of the alkyl group which has 1 to 6 carbon atoms and is represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same substituents as the substituents that $Y^1$ in Formula (Ar-1) may have.

Suitable examples of such a polymerizable liquid crystal compound (I) include compounds represented by Formulae (1) and (12), and specifically, respective compounds having side chain structures shown in Tables 1 and 2 below as K (side chain structure) in Formulae (1) and (12) are mentioned.

Moreover, in Tables 1 and 2 below, "*" shown in the side chain structure as K represents a bonding position to an aromatic ring.

In addition, in the following description, a compound which is represented by Formula (1) and has a group shown in 1-1 in Table 1 below is referred to as a "compound (1-1-1)", and compounds having other structural formulae and groups are also referred to in the same manner. For example, a compound which is represented by Formula (2) and has a group shown in 2-3 in Table 2 below can be referred to as a "compound (2-2-3)".

Furthermore, in the side chain structures represented by 1-2 in Table 1 below and 2-2 in Table 2 below, each group adjacent to an acryloyloxy group and a methacryloyl group represents a propylene group (a group in which a methyl group is substituted with an ethylene group), and represents a mixture of positional isomers having methyl groups at different positions.

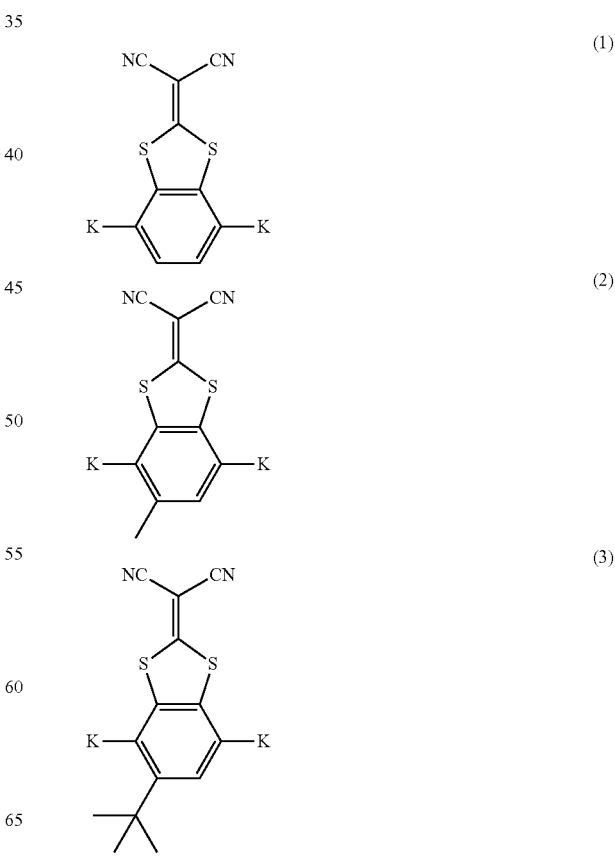

-continued
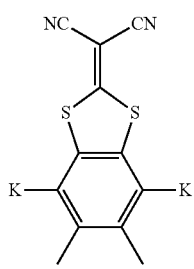
(4)
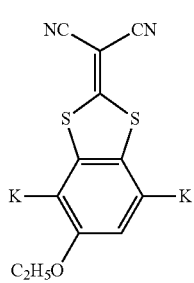
(5)
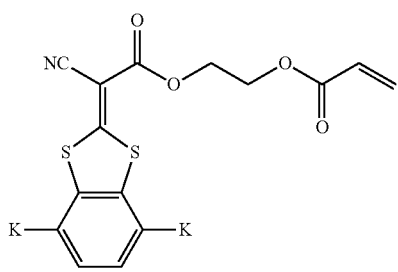
(6)
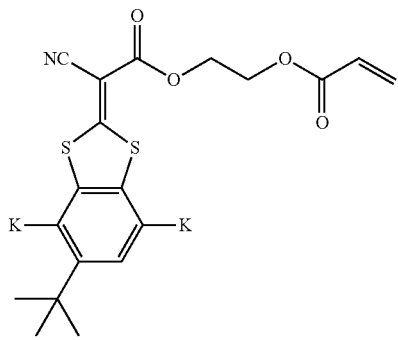
(7)
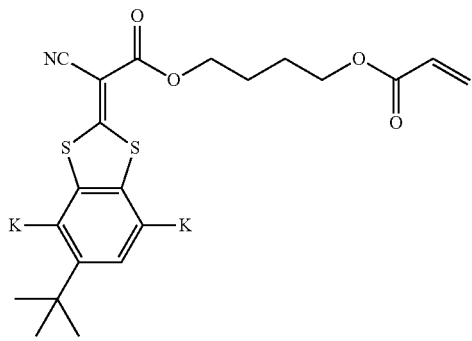
(8)
-continued
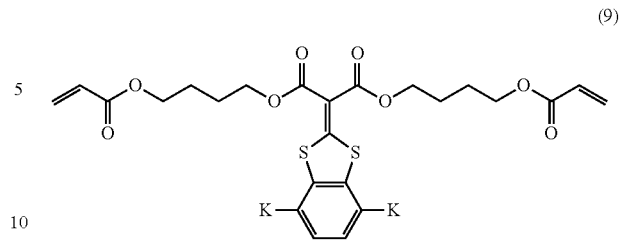
(9)
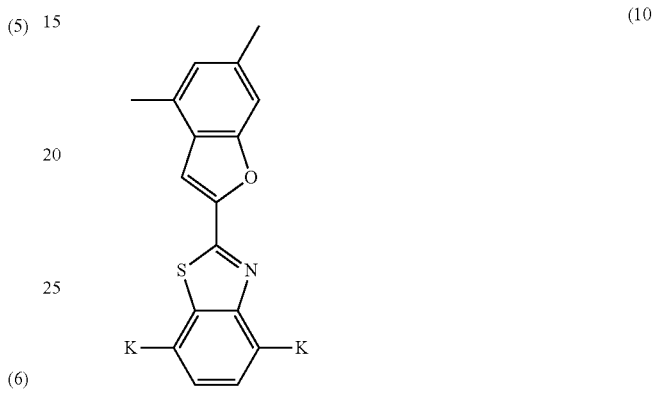
(10)
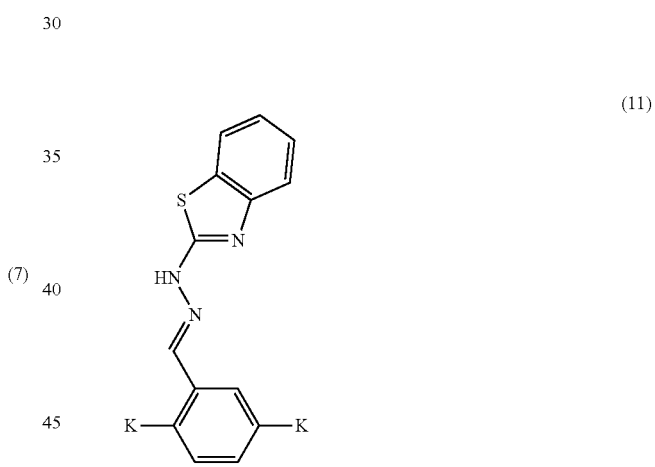
(11)
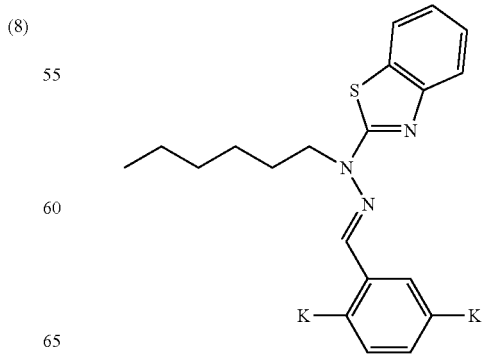
(12)

TABLE 1

| | K (side chain structure) |
|---|---|
| 1-1 | (structure) |
| 1-2 | (structure) |
| 1-3 | (structure) |
| 1-4 | (structure) |
| 1-5 | (structure) |
| 1-6 | (structure) |
| 1-7 | (structure) |
| 1-8 | (structure) |
| 1-9 | (structure) |
| 1-10 | (structure) |
| 1-11 | (structure) |

TABLE 1-continued

K (side chain structure)

1-12, 1-13, 1-14: [chemical structures]

TABLE 2

K (side chain structure)

2-1, 2-2, 2-3, 2-4, 2-5, 2-6, 2-7: [chemical structures]

TABLE 2-continued

| K (side chain structure) |
|---|
| 2-8 [structure] |
| 2-9 [structure] |
| 2-10 [structure] |
| 2-11 [structure] |
| 2-12 [structure] |
| 2-13 [structure] |
| 2-14 [structure] |

A content of the polymerizable liquid crystal compound represented by Formula (I) in the composition is not particularly limited, but is preferably 50% to 100% by mass and more preferably 70% to 99% by mass with respect to the total solid content in the composition.

The solid content means other components excluding a solvent in the composition, and the other components are calculated as the solid content even in a case where a property of the components is a liquid.

The composition may contain other components in addition to the polymerizable liquid crystal compound represented by Formula (I).

(Liquid Crystal Compound)

The composition may contain another liquid crystal compound in addition to the polymerizable liquid crystal compound represented by Formula (I). As the other liquid crystal compound, known liquid crystal compounds (a rod-shaped liquid crystal compound and a disk-shaped liquid crystal compound) are mentioned. The other liquid crystal compound may have a polymerizable group.

(Polymerizable Monomer)

The composition may contain other polymerizable monomers in addition to the polymerizable liquid crystal compound represented by Formula (I) and the other liquid crystal compound having a polymerizable group. Among them, from the viewpoint that hardness of the optically anisotropic layer is superior, a polymerizable compound (polyfunctional polymerizable monomer) having two or more polymerizable groups is preferable.

As the polyfunctional polymerizable monomer, a polyfunctional radically polymerizable monomer is preferable. Examples of the polyfunctional radically polymerizable monomer include the polymerizable monomer described in paragraphs [0018] to [0020] of JP2002-296423A.

Furthermore, in a case where the composition contains the polyfunctional polymerizable monomer, a content of the polyfunctional polymerizable monomer is preferably 1% to 50% by mass and more preferably 2% to 30% by mass with respect to the total mass of the polymerizable liquid crystal compound represented by Formula (I).

(Polymerization Initiator)

The composition may contain a polymerization initiator.

The polymerization initiator is preferably a photopolymerization initiator capable of initiating a polymerization reaction upon irradiation with ultraviolet rays.

Examples of the photopolymerization initiator include the α-carbonyl compound (described in each of the specifications of U.S. Pat. Nos. 2,367,661A and 2,367,670A), the acyloin ether (described in the specification of U.S. Pat. No. 2,448,828A), the α-hydrocarbon-substituted aromatic acyloin compound (described in the specification of U.S. Pat. No. 2,722,512A), the polynuclear quinone compound (described in each of the specifications of U.S. Pat. Nos. 3,046,127A and 2,951,758A), the combination of a triarylimidazole dimer and p-aminophenyl ketone (described in the specification of U.S. Pat. No. 3,549,367A), the acridine and phenazine compounds (described in JP1985-105667A (JP-S60-105667A) and the specification of U.S. Pat. No. 4,239,850A), the oxadiazole compound (described in the specification of U.S. Pat. No. 4,212,970A), and the acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

As the polymerization initiator, an oxime-type polymerization initiator is preferable and a compound represented by Formula (2) is more preferable.

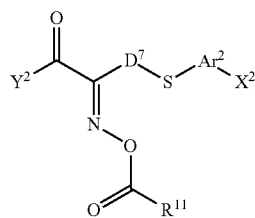

(2)

In Formula (2), $X^2$ represents a hydrogen atom or a halogen atom.

Moreover, in Formula (2), $Ar^2$ represents a divalent aromatic group, and $D^7$ represents a divalent organic group having 1 to 12 carbon atoms.

Furthermore, in Formula (2), $R^{11}$ represents an alkyl group having 1 to 12 carbon atoms, and $Y^2$ represents a monovalent organic group.

Examples of the halogen atom represented by $X^2$ in Formula (2) include a fluorine atom, a chlorine atom, a bromine atom, and an iodine atom, and a chlorine atom is preferable.

Examples of the divalent aromatic group represented by $Ar^2$ in Formula (2) include a divalent group having: an aromatic hydrocarbon ring such as a benzene ring, a naphthalene ring, an anthracene ring, and a phenanthroline ring; or an aromatic heterocyclic ring such as a furan ring, a pyrrole ring, a thiophene ring, a pyridine ring, a thiazole ring, and a benzothiazole ring.

Examples of the divalent organic group which has 1 to 12 carbon atoms and is represented by $D^7$ in Formula (2) include a linear or branched alkylene group having 1 to 12 carbon atoms, and specific examples thereof include a methylene group, an ethylene group, and a propylene group.

Examples of the alkyl group which has 1 to 12 carbon atoms and is represented by $R^{11}$ in Formula (2) include a methyl group, an ethyl group, and a propyl group.

Examples of the monovalent organic group represented by $Y^2$ in Formula (2) include a functional group including a benzophenone skeleton $((C_6H_5)_2CO)$. Specifically, as in the groups represented by Formula (2a) and Formula (2b), a functional group including a benzophenone skeleton in which a benzene ring at a terminal is unsubstituted or mono-substituted is preferable. Moreover, in Formula (2a) and Formula (2b), * represents a bonding position, that is, a bonding position to the carbon atom of the carbonyl group in Formula (2).

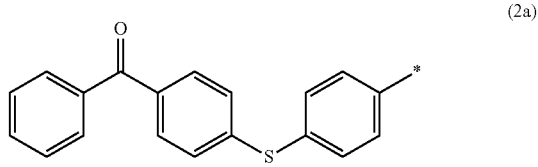

(2a)

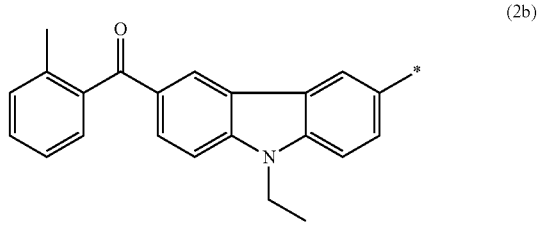

(2b)

Examples of the compound represented by Formula (2) include a compound represented by Formula S-1 and a compound represented by Formula S-2.

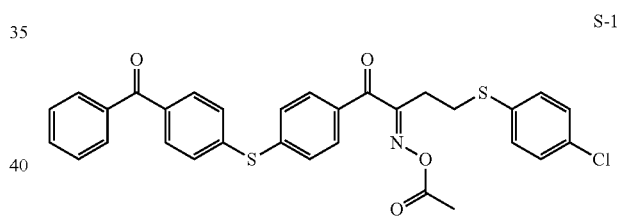

S-1

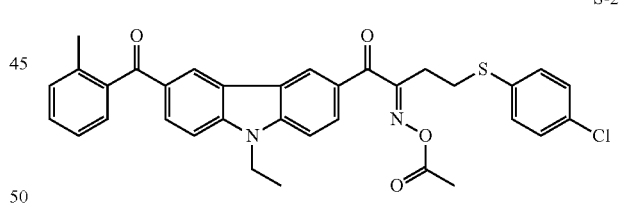

S-2

A content of the polymerization initiator in the composition is not particularly limited, but is preferably 0.01% to 20% by mass and more preferably 0.5% to 5% by mass with respect to the total solid content in the composition.

(Solvent)

The composition may contain a solvent from the viewpoint of workability for forming the optically anisotropic layer.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halocarbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

These solvents may be used alone or in combination of two or more thereof.

(Leveling Agent)

The composition may contain a leveling agent from the viewpoint that the surface of the optically anisotropic layer is kept smooth.

As the leveling agent, for a reason of a high leveling effect on the addition amount, a fluorine-based leveling agent or a silicon-based leveling agent is preferable, and from the viewpoint that weeping (bloom or bleed) is less likely to be caused, a fluorine-based leveling agent is more preferable.

Examples of the leveling agent include the compound described in paragraphs [0079] to [0102] of JP2007-069471A, the polymerizable liquid crystal compound (particularly, the compound described in paragraphs [0020] to [0032]) which is represented by General Formula (I) and described in JP2013-047204A, the polymerizable liquid crystal compound (particularly, the compound described in paragraphs [0022] to [0029]) which is represented by General Formula (I) and described in JP2012-211306A, the liquid crystal alignment promoter (particularly, the compound described in paragraphs [0076] to [0078] and paragraphs [0082] to [0084]) which is represented by General Formula (I) and described in JP2002-129162A, and the compounds (particularly, the compounds described in paragraphs [0092] to [0096]) which are represented by General Formulae (I), (II), and (III) and described in JP2005-099248A. Furthermore, the leveling agent may also have a function as an alignment control agent which will be described later.

(Alignment Control Agent)

The composition may contain an alignment control agent, as desired.

The alignment control agent can form various alignment states such as homeotropic alignment (vertical alignment), tilt alignment, hybrid alignment, and cholesteric alignment in addition to homogeneous alignment, and can realize a specific alignment state by more uniform and more precise control.

As an alignment control agent which promotes homogeneous alignment, for example, a low-molecular-weight alignment control agent and a high-molecular-weight alignment control agent can be used.

With regard to the low-molecular-weight alignment control agent, reference can be made to the description in, for example, paragraphs [0009] to [0083] of JP2002-020363A, paragraphs [0111] to [0120] of JP2006-106662A, and paragraphs [0021] to [0029] of JP2012-211306A, the contents of which are incorporated herein by reference.

Furthermore, with regard to the high-molecular-weight alignment control agent, reference can be made to, for example, paragraphs [0021] to [0057] of JP2004-198511A and paragraphs [0121] to [0167] of JP2006-106662A, the contents of which are incorporated herein by reference.

In addition, examples of an alignment control agent which forms or promotes homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are incorporated herein by reference.

In a case where the alignment control agent is contained, the content thereof is preferably 0.01% to 10% by mass and more preferably 0.05% to 5% by mass with respect to the total solid content in the composition.

(Other Components)

The composition may contain components other than the above-mentioned components, and examples thereof include a surfactant, an inclination angle controlling agent, an alignment aid, a plasticizer, and a crosslinking agent.

(Method for Manufacturing Optically Anisotropic Layer)

A method for manufacturing the optically anisotropic layer is not particularly limited, and known methods are mentioned.

For example, a cured coating film (optically anisotropic layer) can be manufactured by applying the composition to a predetermined substrate (for example, a support layer which will be described later) to form a coating film, and subjecting the obtained coating film to a curing treatment (irradiation with active energy rays (light irradiation treatment) and/or heating treatment). Moreover, an alignment film, which will be described later, may be used, as desired.

Application of the composition can be carried out by known methods (for example, a wire bar coating method, an extrusion coating method, a direct gravure coating method, a reverse gravure coating method, and a die-coating method).

In the method for manufacturing the optically anisotropic layer, it is preferable that an alignment treatment for a liquid crystal compound contained in the coating film is performed before the curing treatment for the coating film.

The alignment treatment can be performed by drying at room temperature (for example, 20° C. to 25° C.) or heating. In a case of a thermotropic liquid crystal compound, a liquid crystal phase formed by the alignment treatment can be generally transitioned by a change in a temperature or pressure. In a case of a liquid crystal compound having a lyotropic property, the transition can be performed also by a compositional ratio such as an amount of a solvent.

In a case where the alignment treatment is a heating treatment, a heating time (heat-aging time) is preferably 10 seconds to 5 minutes, more preferably 10 seconds to 3 minutes, and still more preferably 10 seconds to 2 minutes.

The above-mentioned curing treatment (irradiation with active energy rays (light irradiation treatment) and/or heating treatment) for the coating film can also be referred to as a fixing treatment for fixing the alignment of the liquid crystal compound.

The fixing treatment is preferably performed by irradiation with active energy rays (preferably ultraviolet rays), and the liquid crystal is fixed by polymerization of the liquid crystal compound.

(Characteristics of Optically Anisotropic Layer)

The optically anisotropic layer is a film formed of the above-mentioned composition.

Optical characteristics of the optically anisotropic layer are not particularly limited, but it is preferable that the optically anisotropic layer functions as a $\lambda/4$ plate.

The $\lambda/4$ plate is a plate having a function of converting linearly polarized light having a specific wavelength to circularly polarized light (or converting circularly polarized light to linearly polarized light), and refers to a plate (optically anisotropic layer) whose in-plane retardation $Re(\lambda)$ at a specific wavelength of 2 nm satisfies $Re(\lambda)=\lambda/4$.

This expression may be achieved at any wavelength (for example, 550 nm) in the visible light range, but the in-plane retardation Re(550) at a wavelength of 550 nm preferably satisfies a relationship of 110 nm≤Re(550)≤160 nm and more preferably satisfies 110 nm≤Re(550)≤150 nm.

It is preferable that Re(450) which is an in-plane retardation of the optically anisotropic layer measured at a wavelength of 450 nm, Re(550) which is an in-plane retardation of the optically anisotropic layer measured at a wavelength of 550 nm, and Re(650) which is an in-plane retardation of the optically anisotropic layer measured at a wavelength of 650 nm have a relationship of Re(450)≤Re(550)≤Re(650). That is, this relationship can be said to be a relationship indicating reciprocal wavelength dispersibility.

The optically anisotropic layer may be an A-plate or a C-plate, and is preferably a positive A-plate.

The positive A-plate can be obtained, for example, by horizontally aligning the polymerizable liquid crystal compound represented by Formula (I).

The optically anisotropic layer may have a single-layered structure or a multi-layer structure.

Furthermore, in a case where the optically anisotropic layer has a multi-layer structure, each layer corresponds to a layer formed of the above-mentioned composition.

A thickness of the optically anisotropic layer is not particularly limited, but is preferably 0.5 to 10 μm and more preferably 1.0 to 5 μm from the viewpoint of reduction in the thickness.

In addition, a relationship between a transmission axis of the polarizer and a slow axis of the optically anisotropic layer in the laminate is not particularly limited.

In a case where the laminate is applied to antireflection application, it is preferable that the optically anisotropic layer is a λ/4 plate, and an angle formed by the transmission axis of the polarizer and the slow axis of the optically anisotropic layer is in a range of 45°±10° (35° to 55°).

Furthermore, in a case where the laminate is applied to optical compensation application of an oblique viewing angle of an in-plane-switching (IPS) liquid crystal, it is preferable that the optically anisotropic layer has a multi-layer structure of the positive A-plate of the 214 plate and the positive C-plate, and the angle formed by the transmission axis of the polarizer and the slow axis of the optically anisotropic layer is in a range of 0°±10° (−10° to) 10° or a range of 90°±10° (80° to 100°).

<Other Layers>

The laminate according to the embodiment of the present invention may have other members in addition to the substrate, the polarizer, and the optically anisotropic layer, which are mentioned above.

Figure 2:
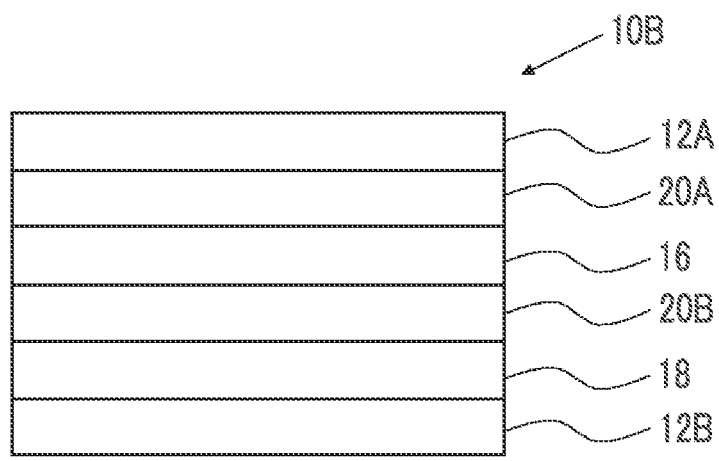
FIG. 2 is a schematic cross-sectional view showing another example of the laminate according to the embodiment of the present invention.

The laminate may further have a polarizer protective film. More specifically, as shown in FIG. 2, a laminate 10B which is another laminate according to the embodiment of the present invention has the first substrate 12A, a first polarizer protective film 20A, the polarizer 16, a second polarizer protective film 20B, the optically anisotropic layer 18, and the second substrate 12B in this order. Moreover, an aspect in which two polarizer protective films (the first polarizer protective film 20A and the second polarizer protective film 20B) are provided is described in FIG. 2, but the present invention is not limited to the aspect, and an aspect in which only one of the first polarizer protective film 20A and the second polarizer protective film 20B is provided may be adopted.

In particular, the laminate preferably has a polarizer protective film between the polarizer and the optically anisotropic layer. In other words, the laminate preferably further has a protective film on the surface of the polarizer on the optically anisotropic layer side.

The configuration of the polarizer protective film is not particularly limited, and may be, for example, a transparent support or a hard coat layer, or a laminate of the transparent support and the hard coat layer.

As the hard coat layer, known layers can be used, and for example, a layer obtained by polymerizing and curing polyfunctional monomers may be used.

In addition, as the transparent support, known transparent supports can be used. Examples of a material forming the transparent support include a cellulose-based resin (hereinafter, also referred to as cellulose acylate) typified by triacetyl cellulose, a norbornene-based resin (ZEONEX or ZEONOR manufactured by Nippon Zeon Co., Ltd., ARTON manufactured by JSR Corporation, and the like), an acrylic resin, a polyester-based resin, and a polystyrene-based resin. Among them, a cellulose-based resin and a norbornene-based resin are preferable, and a norbornene-based resin is more preferable.

Furthermore, the norbornene-based resin refers to a resin having a norbornene skeleton. More specifically, a cycloolefin polymer (COP) and a cycloolefin copolymer (COC) are mentioned.

A moisture permeability of the polarizer protective film is not particularly limited, and is 1 to 3,000 $g/m^2 \cdot day$ in many cases, but from the viewpoint that the effect of the present invention is superior, the moisture permeability of the polarizer protective film is preferably 50 $g/m^2 \cdot day$ or less.

The moisture permeability of the polarizer protective film is measured by the following method. According to the method described in "Testing methods for determination of the water vapour transmission rate of moisture-proof packaging materials (dish method)" which is JIS Z 0208:1976, a mass of water vapor passing through a sample for 24 hours in an atmosphere of a temperature of 40° C. and a relative humidity of 90% is measured, and an amount ($g/m^2 \cdot day$) obtained by converting the measured mass into a value per 1 $m^2$ of an area is calculated.

A thickness of the polarizer protective film is not particularly limited, but is preferably 40 μm or less and more preferably 25 μm or less from the viewpoint that the thickness of the polarizing plate can be reduced. The lower limit is not particularly limited, but is 10 μm or greater in many cases.

The laminate may include an alignment film. The alignment film is a layer having a function of defining the alignment direction of the liquid crystal compound disposed thereon.

The alignment film is usually a film (layer) provided on one surface of the optically anisotropic layer.

Examples of the alignment film include a rubbing-treated film of a layer containing an organic compound such as a polymer, an oblique vapor deposition film of an inorganic compound, and a film having microgrooves.

As the alignment film, a so-called photo-alignment film, which is an alignment film obtained by irradiating a photo-alignment material with polarized light or non-polarized light, is also mentioned.

As the alignment film, a film formed by subjecting a surface of a layer (polymer layer) containing an organic compound such as a polymer to a rubbing treatment is preferable. The rubbing treatment is carried out by rubbing the surface of the polymer layer several times with paper or cloth in a certain direction (preferably, the longitudinal direction of the support). Examples of the polymer used for forming the alignment film include a polyimide-based resin and a polyvinyl alcohol-based resin.

A thickness of the alignment film is not particularly limited as long as the alignment film can exhibit an alignment function, but is preferably 0.01 to 5 μm and more preferably 0.05 to 2 μm.

The laminate may have a pressure sensitive adhesive layer or an adhesive layer between respective layers in order to ensure adhesiveness between the respective layers.

Moreover, the laminate may have a transparent support between the respective layers.

The laminate may have another optically anisotropic layer in addition to the optically anisotropic layer formed of the composition containing the polymerizable liquid crystal compound represented by Formula (I).

The other optically anisotropic layer may be an A-plate or a C-plate.

The laminate may include a touch sensor. A configuration of the touch sensor is not particularly limited, but an electrostatic capacitance-type indium tin oxide (ITO) film, a silver mesh film, a copper mesh film, and a silver nanowire film may be used. Moreover, in order to make an ITO electrode invisible, the laminate may further include a refractive index matching layer.

<Organic Electroluminescent Device and Liquid Crystal Display Device>

The laminate can be preferably used for an organic electroluminescent device (preferably, an organic electroluminescent (EL) display device) and a liquid crystal display device.

(Organic EL Display Device)

As an organic EL display device which is an example of the organic electroluminescent device according to the embodiment of the present invention, for example, an aspect in which the laminate according to the embodiment of the present invention and an organic EL display panel are provided in this order from a visual recognition side is suitably mentioned. The optically anisotropic layer included in the laminate is preferably disposed closer to the organic EL display panel side than the polarizer. In this case, the polarizing plate is used as a so-called antireflection film.

Furthermore, out of the two substrates in the laminate according to the embodiment of the present invention, the substrate disposed on the organic EL display panel side may function as a sealing layer of the organic EL display panel. For example, in a case where the substrate is a glass substrate, out of the two glass substrates in the laminate according to the embodiment of the present invention, the glass substrate disposed on the organic EL display panel side may function as so-called sealing glass.

The organic EL display panel is a display panel constituted with an organic EL element in which an organic light emitting layer (organic electroluminescent layer) is sandwiched between electrodes (between a cathode and an anode). The configuration of the organic EL display panel is not particularly limited, and known configurations are adopted.

(Liquid Crystal Display Device)

A liquid crystal display device according to the embodiment of the present invention is an example of the image display device, and includes the above-mentioned laminate according to the embodiment of the present invention and a liquid crystal layer.

In addition, in the present invention, it is preferable that the polarizer in the laminate according to the embodiment of the present invention is used as the polarizer on the front side among the polarizers provided on the both sides of the liquid crystal layer. Moreover, the optically anisotropic layer included in the polarizing plate is preferably disposed closer to the liquid crystal layer side than the polarizer. In this case, the optically anisotropic layer can be suitably used as an optical compensation film.

Furthermore, out of the two substrates in the laminate according to the embodiment of the present invention, the substrate disposed on the liquid crystal layer side may function as substrates disposed on both sides of the liquid crystal layer. For example, in a case where the substrate is a glass substrate, out of the two substrates in the laminate according to the embodiment of the present invention, the glass substrate disposed on the liquid crystal layer side may function as a glass substrate in a liquid crystal cell including a liquid crystal layer and two glass substrates interposing the liquid crystal layer.

The liquid crystal display device is preferably in a vertical alignment (VA) mode, an optical compensated bend (OCB) mode, an in-plane-switching (IPS) mode, or a twisted nematic (TN) mode, but is not limited thereto.

EXAMPLES

Hereinafter, the present invention will be described in more detail with reference to Examples. However, the present invention is not limited thereto.

<Manufacture of Polarizer 1 with Protective Film>

A surface of a support of a cellulose triacetate film TJ25 (manufactured by FUJIFILM Corporation, thickness of 25 μm) was subjected to an alkali saponification treatment. Specifically, after the support was immersed in a 1.5 N sodium hydroxide aqueous solution at 55° C. for 2 minutes, the support was washed in a water-washing bath at room temperature and further neutralized with a 0.1 N sulfuric acid at 30° C. After neutralization, the support was washed in the water-washing bath at room temperature and further dried with hot air at 100° C. to obtain a polarizer protective film (moisture permeability: greater than 1,000 g/m$^2$·day).

A roll-shaped polyvinyl alcohol film having a thickness of 75 μm was stretched in a machine direction (MD) in an iodine aqueous solution, and dried to obtain a polarizer having a thickness of 14 μm.

The polarizer protective film was bonded to both surfaces of the polarizer to manufacture a polarizer 1 with a protective film.

<Manufacture of Polarizer 2 with Protective Film>

A polarizer 2 with a protective film was manufactured according to the same procedure as in <Manufacture of polarizer 1 with protective film>, except that the polarizer protective film was bonded to one surface of the polarizer.

<Manufacture of Polarizer 3 with Protective Film>

A polarizer protective film was obtained according to the same procedure as in <Manufacture of Polarizer 1 with Protective Film>.

A polarizer (polarizing film) having a thickness of 9 μm was obtained in the same manner as in <Manufacture of polarizer 1 with protective film>, except that the thickness and the stretching ratio of the roll-shaped polyvinyl alcohol film were adjusted.

A polarizer 3 with a protective film was manufactured according to the same procedure as in <Manufacture of polarizer 1 with protective film>, except that the polarizer protective film was bonded to both surfaces of the obtained polarizer.

<Manufacture of Polarizer 4 with Protective Film>

With reference to the description in Example 1 of JP2017-194710A, a laminate film (substrate film/primer layer/polarizer) including a polyvinyl alcohol-based polarizer having a thickness of 4 μm was obtained. Next, the polarizer protective film manufactured in <Manufacture of polarizer 1 with protective film> was bonded onto the polarizer, the substrate film and the primer layer were peeled off from the obtained laminate film, and the polarizer protective film manufactured in <Manufacture of polarizer 1 with protective film> was bonded to an exposed surface of the polarizer to manufacture a polarizer 4 with a protective film.

<Manufacture of Polarizer 5 with Protective Film>

A polarizer protective film was obtained according to the same procedure as in <Manufacture of polarizer 1 with protective film>.

A polarizer having a thickness of 14 μm was obtained according to the same procedure as in <Manufacture of polarizer 1 with protective film>.

Next, the polarizer protective film was bonded to one surface of the polarizer, and a corona-treated cycloolefin polymer (COP) film (thickness: 25 μm, and moisture permeability: 20 g/m²·day) was bonded to the other surface to manufacture a polarizer 5 with protective film.

Example 1: Manufacture of Laminate 1

(Manufacture of Positive A-Plate A-1)

According to the method described in Langmuir, 32 (36), 9245 to 9253 (2016), a monomer m-1 shown below was synthesized using methacrylic acid chloride, 4-aminocyclohexanol (reagent produced by Tokyo Chemical Industry Co., Ltd.), and the following cinnamic acid chloride derivative.

Cinnamic Acid Chloride Derivative

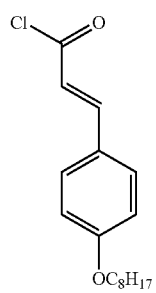

Monomer m-1

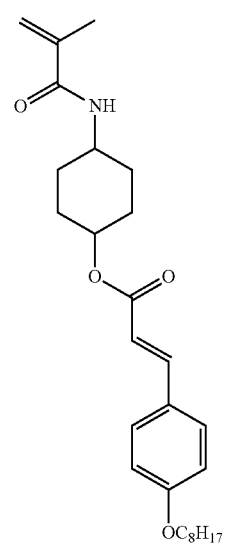

A flask comprising a cooling pipe, a thermometer, and a stirrer was charged with 2-butanone (5 parts by mass) as a solvent, and while flowing nitrogen in the flask at 5 mL/min, the resultant was refluxed by heating in a water bath. A solution obtained by mixing the monomer m-1 (5 parts by mass), CYCLOMER M100 (manufactured by DAICEL CORPORATION) (5 parts by mass), 2,2'-azobis(isobutyronitrile) (1 part by mass), and 2-butanone (5 parts by mass) was added dropwise into the flask over 3 hours, and the resultant was further stirred for 3 hours while maintaining a reflux state.

After the completion of the reaction, the mixture was allowed to cool to room temperature, and 2-butanone (30 parts by mass) was added into the flask for dilution to obtain a polymer solution of about 20% by mass. The obtained polymer solution was poured into a large excess of methanol to precipitate a polymer, and the recovered precipitate was filtered and washed with a large amount of methanol. Thereafter, the obtained solid content was subjected to blast drying at 50° C. for 12 hours to obtain a polymer PA-1 having a photo-aligned group.

Polymer PA-1 (the Following Structural Formula)

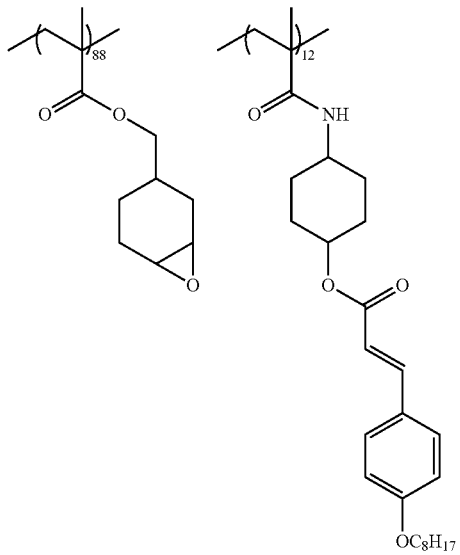

Acid Generator PAG-1 (the Following Structural Formula)

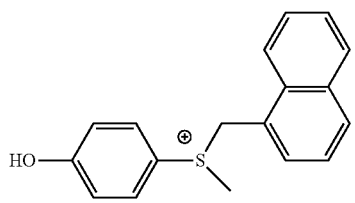

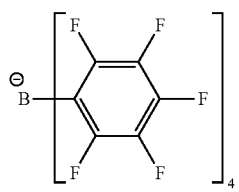

A coating liquid 1 for forming an alignment film, which will be described later, was continuously applied onto a triacetyl cellulose film "Z-TAC" (manufactured by FUJIFILM Corporation) using a wire bar of #2.4. The support on which the coating film was formed was dried with hot air at 140° C. for 120 seconds, and subsequently, the coating film was irradiated with polarized ultraviolet rays (10 mJ/cm², using an ultra-high-pressure mercury lamp) to form an alignment film P-1, whereby a TAC film with a photo-alignment film was obtained.

| (Coating liquid 1 for forming alignment film) | |
|---|---|
| The above polymer PA-1 | 100.00 parts by mass |
| The following acid generator PAG-1 | 1.00 part by mass |
| Isopropyl alcohol | 16.50 parts by mass |
| Butyl acetate | 1,072.00 parts by mass |
| Methyl ethyl ketone | 268.00 parts by mass |

A composition A-1 having the following composition was applied onto the alignment film P-1 using a bar coater. A coating film formed on the alignment film P-1 was heated to 120° C. with hot air and then cooled to 60° C., and the alignment of the liquid crystal compound was fixed by irradiating the coating film with 100 mJ/cm² of ultraviolet rays at a wavelength of 365 nm using a high-pressure mercury lamp in a nitrogen atmosphere, and subsequently irradiating the coating film with 500 mJ/cm² of ultraviolet rays while heating to 120° C., thereby manufacturing a TAC film A-1 having a positive A-plate A-1 serving as an optically anisotropic layer.

In the positive A-plate A-1, the thickness was 2.5 μm and Re(550) was 144 nm. Moreover, the positive A-plate A-1 satisfied a relationship of Re(450)≤Re(550)≤Re(650).

| (Composition A-1) | |
|---|---|
| The following polymerizable liquid crystal compound L-1 | 43.50 parts by mass |
| The following polymerizable liquid crystal compound L-2 | 43.50 parts by mass |
| The following polymerizable liquid crystal compound L-3 | 8.00 parts by mass |
| The following polymerizable liquid crystal compound L-4 | 5.00 parts by mass |
| The following polymerization initiator PI-1 | 0.55 parts by mass |
| The following leveling agent T-1 | 0.20 parts by mass |
| Cyclopentanone | 235.00 parts by mass |

Polymerizable Liquid Crystal Compound L-1

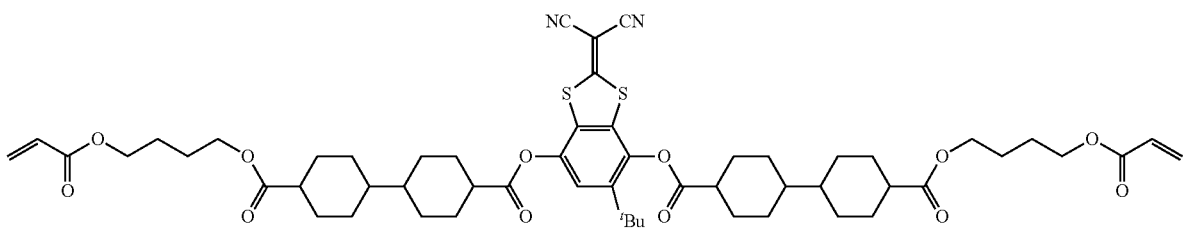 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystal Compound L-2

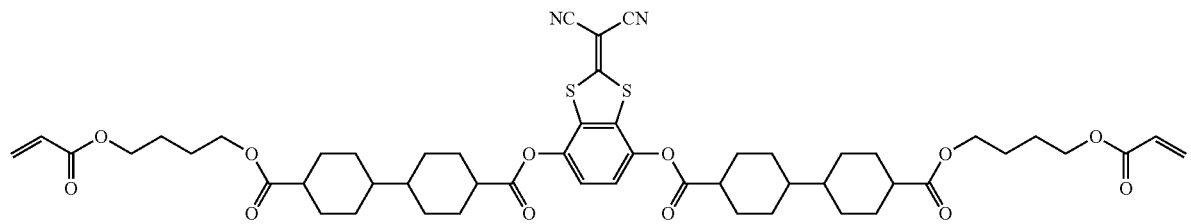 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystal Compound L-3

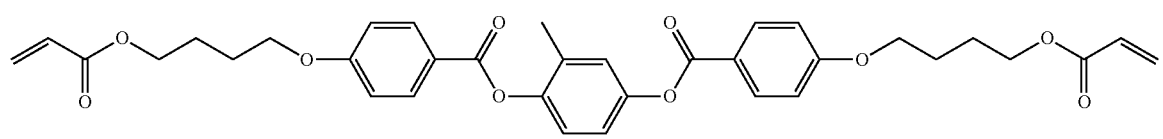 [SMILES: C=CC(=O)OCCCCOc1ccc(C(=O)Oc2ccc(OC(=O)c3ccc(OCCCCOC(=O)C=C)cc3)c(C)c2)cc1]

Polymerizable Liquid Crystal Compound L-4

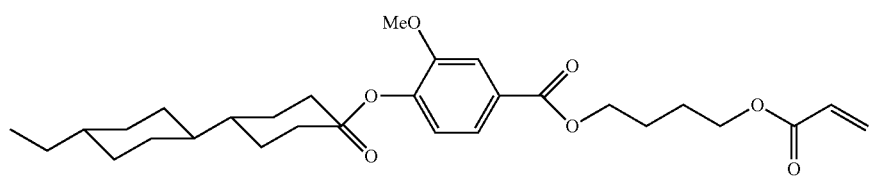

Polymerization Initiator PI-1

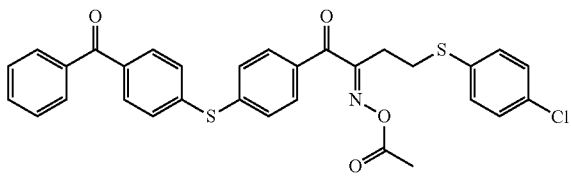 [SMILES: CC(=O)O/N=C(\CCSc1ccc(Cl)cc1)C(=O)c1ccc(Sc2ccc(C(=O)c3ccccc3)cc2)cc1]

Leveling Agent T-1

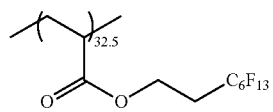

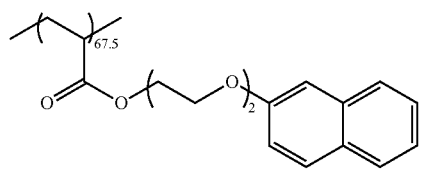

(Preparation of Pressure Sensitive Adhesive)

A film (1) with a pressure sensitive adhesive was manufactured according to the procedure in Example 1 of JP2017-134414A.

(Manufacture of Circularly Polarizing Plate 1 and Laminate 1)

A surface on the side of the positive A-plate A-1 in the TAC film A-1 was bonded to one surface of the polarizer 1 with a protective film using the film (1) with a pressure sensitive adhesive so that the angle formed by the absorption axis of the polarizer in the polarizer 1 with a protective film and the slow axis of the positive A-plate A-1 was 45°. Specifically, a pressure sensitive adhesive of the film (1) with a pressure sensitive adhesive was bonded to one surface of the polarizer 1 with a protective film, a film in the film (1) with a pressure sensitive adhesive was peeled off, and the positive A-plate A-1 in the TAC film A-1 was further bonded to the pressure sensitive adhesive on the polarizer 1.

Subsequently, the TAC film with a photo-alignment film was removed from the obtained bonded product by peeling at an interface between the photo-alignment film and the positive A-plate A-1, to obtain a circularly polarizing plate 1 including the polarizer 1 with a protective film and the positive A-plate A-1. Next, the both sides of the circularly polarizing plate 1 were interposed between two glass plates using the film (1) with a pressure sensitive adhesive to manufacture a laminate 1 having the circularly polarizing plate 1 interposed between the two glass plates.

A moisture permeability of the glass plate was measured using a water vapor transmission measuring device (AQUA-TRAN 2 (registered trademark) manufactured by MOCON, INC.) in an atmosphere of 40° C. and 90% RH, and, as a result, was less than $1.0 \times 10^{-3}$ g/m²·day.

Examples 2 to 5

Circularly polarizing plates 2 to 5 and laminates 2 to 5 were manufactured according to the same procedure as in Example 1, except that the polarizer 1 with a protective film was changed to polarizers 2 to 5 with a protective film as shown in Table 3.

Example 6

According to the same procedure as in Example 1 except that the composition A-1 was changed to the following composition A-2 and the thickness of the optically anisotropic layer was adjusted, a positive A-plate A-2 having a thickness of 2.7 μm was formed, and a circularly polarizing plate 6 and a laminate 6 were manufactured.

Moreover, the positive A-plate A-2 satisfied a relationship of $Re(450) \leq Re(550) \leq Re(650)$.

| (Composition A-2) | |
|---|---|
| The above polymerizable liquid crystal compound L-1 | 95.00 parts by mass |
| The above polymerizable liquid crystal compound L-4 | 5.00 parts by mass |
| The above polymerization initiator PI-1 | 0.55 parts by mass |
| The above leveling agent T-1 | 0.20 parts by mass |
| Chloroform | 580.00 parts by mass |

Example 7

According to the same procedure as in Example 1 except that the composition A-1 was changed to the following composition A-3 and the thickness of the optically anisotropic layer was adjusted, a positive A-plate A-3 having a thickness of 2.1 μm was formed, and a circularly polarizing plate 7 and a laminate 7 were manufactured.

Moreover, the positive A-plate A-3 satisfied a relationship of $Re(450) \leq Re(550) \leq Re(650)$.

| (Composition A-3) | |
|---|---|
| The above polymerizable liquid crystal compound L-2 | 95.00 parts by mass |
| The above polymerizable liquid crystal compound L-4 | 5.00 parts by mass |
| The above polymerization initiator PI-1 | 0.55 parts by mass |
| The above leveling agent T-1 | 0.20 parts by mass |
| Chloroform | 580.00 parts by mass |

Comparative Example 1

According to the same procedure as in Example 1 except that the composition A-1 was changed to the following composition A-4 and the thickness of the optically anisotropic layer was adjusted, a positive A-plate A-4 having a thickness of 2.3 μm was formed, and a circularly polarizing plate 8 and a laminate 8 were manufactured.

| (Composition A-4) | |
|---|---|
| The following polymerizable liquid crystal compound L-5 | 42.00 parts by mass |
| The following polymerizable liquid crystal compound L-6 | 42.00 parts by mass |
| The above polymerizable liquid crystal compound L-4 | 16.00 parts by mass |
| The above polymerization initiator PI-1 | 0.55 parts by mass |
| The above leveling agent T-1 | 0.20 parts by mass |
| Methyl ethyl ketone | 240.00 parts by mass |

Polymerizable Liquid Crystal Compound L-5

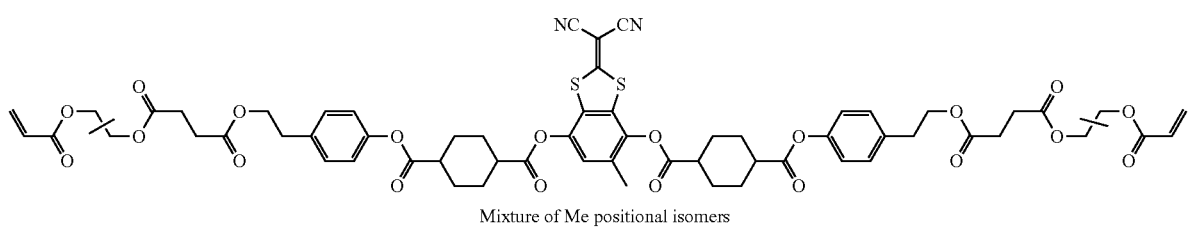

Mixture of Me positional isomers

Polymerizable Liquid Crystal Compound L-6

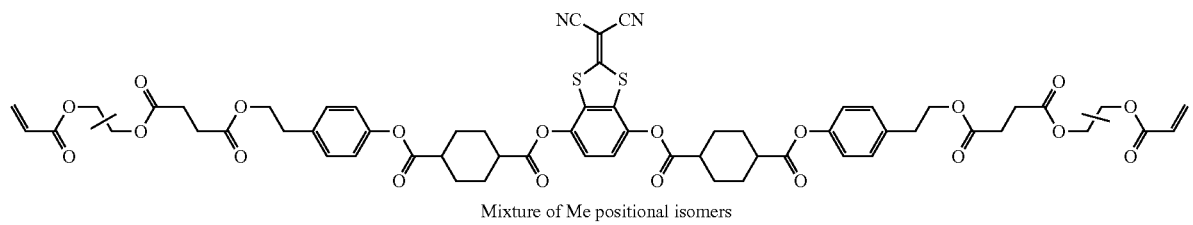

Mixture of Me positional isomers

Comparative Example 2

A circularly polarizing plate 9 and a laminate 9 were manufactured according to the same procedure as in Example 8, except that the polarizer 1 with a protective film was changed to the polarizer 2 with a protective film.

<Evaluation: Thermal Durability Test>

Regarding the laminates obtained in Examples and Comparative Examples, thermal durability of an in-plane retardation (Re) at a wavelength of 550 nm was evaluated using AxoScan (OPMF-1, manufactured by Axometrics, Inc.) according to the following indices. The results are shown in Table 3.

Furthermore, regarding the thermal durability test conditions, the test, in which the laminate was left in an environment (in particular, a relative humidity was 10% or less because humidity adjustment was not performed) of 85° C. for 600 hours, was performed. In a case where an evaluation result is "B" or higher, it can be determined that thermal durability is favorable.

AAA: The change amount between the initial Re value and the Re value after the test was less than 1% with respect to the initial value AA: The change amount between the initial Re value and the Re value after the test was 1% or greater and less than 2% with respect to the initial value A: The change amount between the initial Re value and the Re value after the test was 2% or greater and less than 3% with respect to the initial value B: The change amount between the initial Re value and the Re value after the test was 3% or greater and less than 5% with respect to the initial value C: The change amount between the initial Re value and the Re value after the test was 5% or greater and less than 15% with respect to the initial value D: The change amount between the initial Re value and the Re value after the test was 15% or greater with respect to the initial value In Table 3, "TAC" indicates cellulose triacetate and "COP" indicates a cycloolefin polymer.

TABLE 3

| | | Optically anisotropic layer | | | Polarizer with protective film | | |
|---|---|---|---|---|---|---|---|
| | Type of laminate | Type | Liquid crystal compound | Re(450)/Re(550) | Type | Protective film of polarizer on optically anisotropic layer side | Thickness (μm) of polarizer | Evaluation |
| Example 1 | 1 | A-1 | L-1 L-2 L-3 L-4 | 0.82 | 1 | TAC | 14 | A |
| Example 2 | 2 | A-1 | L-1 L-2 L-3 L-4 | 0.82 | 2 | None | 14 | A |
| Example 3 | 3 | A-1 | L-1 L-2 L-3 L-4 | 0.82 | 3 | TAC | 9 | AA |
| Example 4 | 4 | A-1 | L-1 L-2 L-3 L-4 | 0.82 | 4 | TAC | 4 | AAA |
| Example 5 | 5 | A-1 | L-1 L-2 L-3 L-4 | 0.82 | 5 | COP | 14 | AA |
| Example 6 | 6 | A-2 | L-1 L-4 | 0.7 | 1 | TAC | 14 | A |
| Example 7 | 7 | A-3 | L-2 L-4 | 0.6 | 1 | TAC | 14 | B |
| Comparative Example 1 | 8 | A-4 | L-5 L-6 L-4 | 0.87 | 1 | TAC | 14 | D |
| Comparative Example 2 | 9 | A-4 | L-5 L-6 L-4 | 0.87 | 2 | None | 14 | D |

As shown in Table 3, it was confirmed that in a case of the laminate according to the embodiment of the present invention, a desired effect could be obtained.

In particular, from comparison of Examples 1, 3, and 4, it was confirmed that in a case where the thickness of the polarizer was less than 10 μm (preferably, 5 μm or less), the effect was superior.

Moreover, from comparison of Examples 1 and 5, it was confirmed that in a case where the polarizer protective film was a COP film, the effect was superior.

Examples 8 to 14

(Manufacture of Positive C-Plate 1)

As a temporary support, a triacetyl cellulose film "Z-TAC" (manufactured by FUJIFILM Corporation) was used (the film will be referred to as a cellulose acylate film 2).

The cellulose acylate film 2 was allowed to pass through a dielectric heating roll at a temperature of 60° C., the film surface temperature was elevated to 40° C., then an alkaline solution having the composition shown below was applied onto one surface of the film at an application amount of 14 ml/m² using a bar coater, and the film was transported for 10 seconds under a steam-type far infrared heater manufactured by NORITAKE CO., LIMITED while heating at 110° C.

Next, pure water was applied onto the film at 3 ml/m² using the same bar coater.

Subsequently, water-washing using a fountain coater and drainage using an air knife were repeated three times, and then the film was transported to a drying zone at 70° C. for 10 seconds for drying to manufacture a cellulose acylate film 2 subjected to the alkali saponification treatment.

| (Alkaline solution) | |
|---|---|
| Potassium hydroxide | 4.7 parts by mass |
| Water | 15.8 parts by mass |
| Isopropanol | 63.7 parts by mass |
| Surfactant SF-1 ($C_{14}H_{29}O(CH_2CH_2O)_{20}H$) | 1.0 part by mass |
| Propylene glycol | 14.8 parts by mass |

A coating liquid 2 for forming an alignment film having the following composition was continuously applied onto the cellulose acylate film 2 subjected to the alkali saponification treatment using a wire bar of #8. The obtained film was dried with hot air at 60° C. for 60 seconds and further dried with hot air at 100° C. for 120 seconds to form an alignment film.

| (Coating liquid 2 for forming alignment film) | |
|---|---|
| Polyvinyl alcohol (manufactured by KURARAY CO., LTD., PVA 103) | 2.4 parts by mass |
| Isopropyl alcohol | 1.6 parts by mass |
| Methanol | 36 parts by mass |
| Water | 60 parts by mass |

A coating liquid C-1 for forming a positive C-plate, which will be described later, was applied onto the alignment film, the obtained coating film was aged at 60° C. for 60 seconds and then irradiated with 1,000 mJ/cm² of ultraviolet rays in air using an air-cooled metal halide lamp (manufactured by EYE GRAPHICS Co., Ltd.) at 70 mW/cm², and the alignment state was fixed to vertically align a liquid crystal compound, thereby manufacturing a positive C-plate 1.

Rth(550) of the obtained positive C-plate was −60 nm.

| (Coating liquid C-1 for forming positive C-plate) | |
|---|---|
| The following liquid crystal compound L-11 | 80 parts by mass |
| The following liquid crystal compound L-12 | 20 parts by mass |
| The following vertical alignment agent (S01) for liquid crystal compound | 1 part by mass |
| Ethylene oxide-modified trimethylol propane triacrylate (V#360, manufactured by OSAKA ORGANIC CHEMICAL INDUSTRY LTD.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| The following compound B03 | 0.4 parts by mass |
| Methyl ethyl ketone | 170 parts by mass |
| Cyclohexanone | 30 parts by mass |

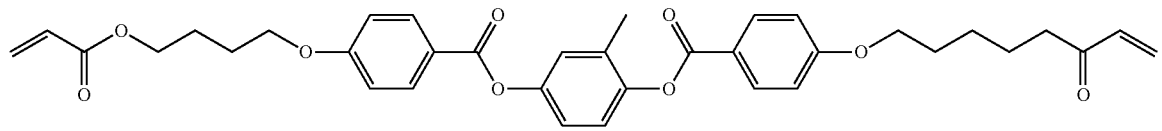

L-11

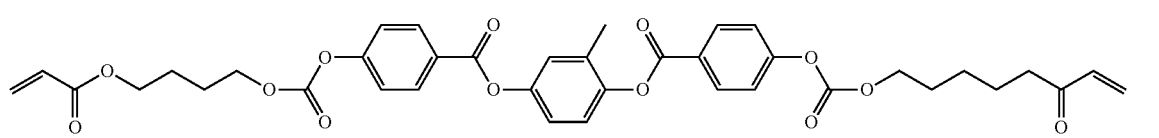

L-12

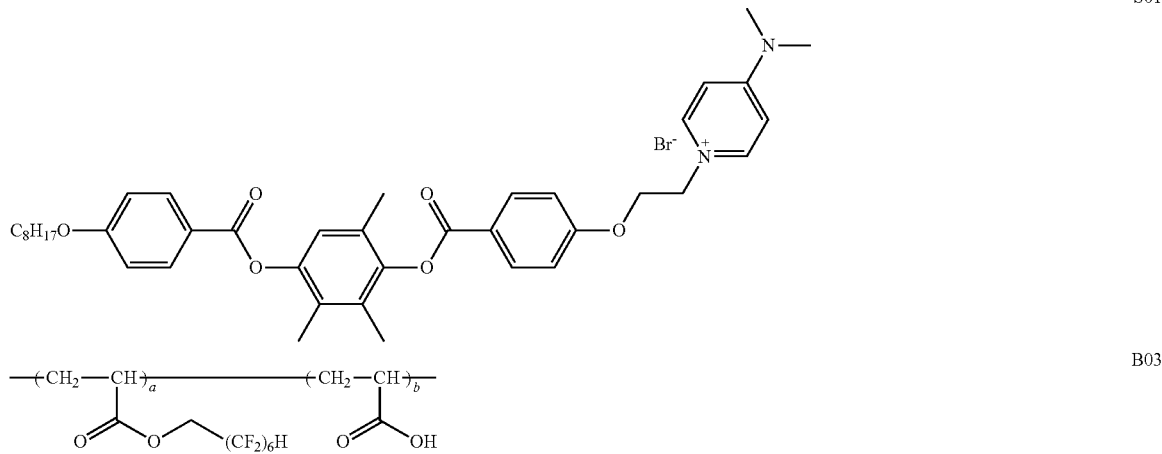

S01

B03

Furthermore, in the formula, a and b indicate a content of each repeating unit with respect to all repeating units, and a was 90% by mass and b was 10% by mass.

(Manufacture of Polarizing Plate)

The positive C-plate 1 manufactured above was bonded onto each positive A-plate side of the circularly polarizing plates of Examples 1 to 7 using the film (1) with a pressure sensitive adhesive, and the alignment film and the cellulose acylate film 1 were removed to obtain circularly polarizing plates 8 to 14.

GALAXY S5 manufactured by SAMSUNG, which has an organic EL display panel (organic EL display element) installed therein, was disassembled, a touch panel with a circularly polarizing plate was peeled from the organic EL display device, the circularly polarizing plate was further peeled from the touch panel, and the organic EL display element (with sealing glass), the touch panel, and the circularly polarizing plate were each isolated. Subsequently, the isolated touch panel was bonded again to the organic EL display element, each of the manufactured circularly polarizing plates 8 to 14 was bonded onto the touch panel so that the side of the positive C-plate 1 was the touch panel side, and cover glass was further disposed thereon to manufacture an organic EL display device.

Furthermore, in the organic EL display device, the circularly polarizing plate was disposed between the sealing glass and the cover glass. The moisture permeabilities of the sealing glass and the cover glass were all less than $1.0 \times 10^{-3}$ g/m²·day. That is, in the organic EL display device, the configuration from the sealing glass to the cover glass corresponds to the laminate according to the embodiment of the present invention.

It was confirmed that the manufactured organic EL display device exhibited an antireflection effect.

EXPLANATION OF REFERENCES 10A, 10B: Laminate
12A: First substrate
12B: Second substrate
14: Polarizing plate
16: Polarizer
18: Optically anisotropic layer
20A: First polarizer protective film
20B: Second polarizer protective film

What is claimed is:
1. A laminate comprising:
two substrates; and
a polarizing plate disposed between the two substrates,
wherein the polarizing plate has a polarizer and an optically anisotropic layer,
the polarizer contains a polyvinyl alcohol-based resin,
the optically anisotropic layer is formed of a composition containing a polymerizable liquid crystal compound represented by Formula (I),
the optically anisotropic layer is both a λ/4 plate and a positive A plate,
wherein the positive A plate satisfies the relationship of Formula (A1) where a refractive index in an in-plane slow axis direction (in a direction in which an in-plane refractive index is maximum) is defined as nx, a refractive index in an in-plane direction perpendicular to the in-plane slow axis is defined as ny, and a refractive index in a thickness direction is defined as nz, and Rth is a positive value:

$$nx > ny \approx nz \qquad \text{Formula (A1)},$$

$Rth(\lambda) = ((nx+ny)/2 - nz) \times d$, in which $d$ is the thickness of the plate, and a moisture permeability of each substrate is $10^{-3}$ g/m²·day or less,

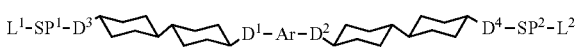

(I)

in Formula (I), $D^1$, $D^2$, $D^3$, and $D^4$ each independently represent a single bond, —CO—O—, —C(=S)O—, —CR$^1$R$^2$—, —CR$^1$R$^2$CR$^3$R$^4$—, —O—CR$^1$R$^2$—, —CR$^1$R2-O—CR$^3$R4-, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—, where R$^1$, R$^2$, R$^3$, and R$^4$ each independently represent a hydrogen atom, a fluorine atom, or an alkyl group having 1 to 4 carbon atoms;
SP$^1$ and SP$^2$ each independently represent a single bond, a linear or branched alkylene group having 1 to 12 carbon atoms, or a divalent linking group in which one or more —CH$_2$—'s constituting a linear or branched alkylene group having 1 to 12 carbon atoms are substituted with —O—, —S—, —NH—, —N(Q)-, or —CO—, and Q represents a substituent;

L$^1$ and L$^2$ each independently represent a monovalent organic group, and at least one of L$^1$ or L$^2$ represents a polymerizable group, provided that in a case where Ar is a group represented by Formula (Ar-3), at least one of L$^1$ or L$^2$, or L$^3$ or L$^4$ in Formula (Ar-3) represents a polymerizable group; and Ar represents any one aromatic ring selected from the group consisting of groups represented by Formulae (Ar-1) to (A-7),

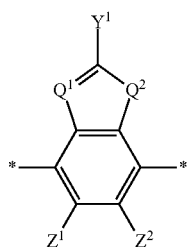

(Ar-1)

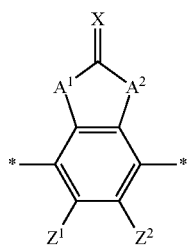

(Ar-2)

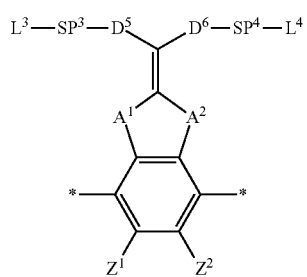

(Ar-3)

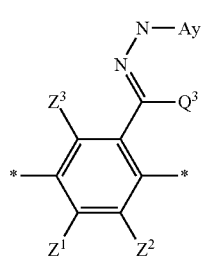

(Ar-4)

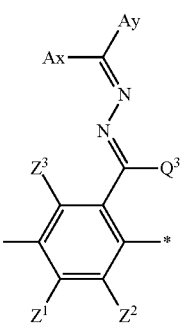

(Ar-5)

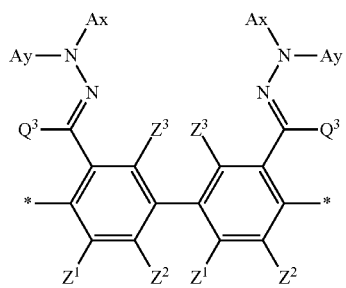

(Ar-6)

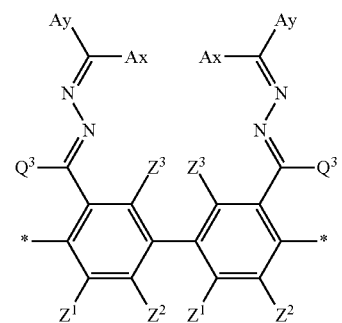

(Ar-7)

here, in Formulae (Ar-1) to (Ar-7), * represents a bonding position to D$^1$ or D$^2$;

Q$^1$ represents N or CH;

Q$^2$ represents —S—, —O—, or —N(R$^5$)—, and R$^5$ represents a hydrogen atom or an alkyl group having 1 to 6 carbon atoms;

Y$^1$ represents an aromatic hydrocarbon group having 6 to 12 carbon atoms or an aromatic heterocyclic group having 3 to 12 carbon atoms, which may have a substituent;

Z$^1$, Z$^2$, and Z$^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —OR$^6$, —NR$^7$R$^8$, or —SR$^9$, and R$^6$ to R$^9$ each independently represent a hydrogen atom or an alkyl group having 1 to 6 carbon atoms, and Z$^1$ and Z$^2$ may be bonded to each other to form an aromatic ring;

A$^1$ and A$^2$ each independently represent a group selected from the group consisting of —O—, —N(R$^{10}$)—, —S—, and —CO—, and R$^{10}$ represents a hydrogen atom or a substituent;

X represents a non-metallic atom of Group 14 to Group 16, to which a hydrogen atom or a substituent may be bonded;

$D^5$ and $D^6$ each independently represent a single bond, or a divalent linking group consisting of —CO—, —O—, —S—, —C(=S)—, —CR$^{1a}$R$^{2a}$—, —CR$^{3a}$=CR$^{4a}$—, —NR$^{5a}$—, or a combination of two or more thereof, and R$^{1a}$ to R$^{5a}$ each independently represent a hydrogen atom, a fluorine atom, or an alkyl group having 1 to 4 carbon atoms;

SP$^3$ and SP$^4$ each independently represent a single bond, a linear or branched alkylene group having 1 to 12 carbon atoms, or a divalent linking group in which one or more —CH$_2$—'s constituting a linear or branched alkylene group having 1 to 12 carbon atoms are substituted with —O—, —S—, —NH—, —N(Q)-, or —CO—, and Q represents a substituent;

L$^3$ and L$^4$ each independently represent a monovalent organic group, and at least one of L$^3$ or L$^4$, or L$^1$ or L$^2$ in Formula (I) represents a polymerizable group;

Ax represents an organic group which has 2 to 30 carbon atoms and has at least one aromatic ring selected from the group consisting of an aromatic hydrocarbon ring and an aromatic heterocyclic ring;

Ay represents a hydrogen atom, an alkyl group which has 1 to 12 carbon atoms and may have a substituent, or an organic group which has 2 to 30 carbon atoms and has at least one aromatic ring selected from the group consisting of an aromatic hydrocarbon ring and an aromatic heterocyclic ring;

the aromatic rings in Ax and Ay may each have a substituent, and Ax and Ay may be bonded to each other to form a ring; and Q$^3$ represents a hydrogen atom or an alkyl group which has 1 to 6 carbon atoms and may have a substituent.

2. The laminate according to claim 1, wherein a thickness of the polarizer is less than 10 μm.

3. The laminate according to claim 1, further comprising: a polarizer protective film provided between the polarizer and the optically anisotropic layer, wherein a moisture permeability of the polarizer protective film is 50 g/m$^2$·day or less.

4. The laminate according to claim 3, wherein the polarizer protective film contains a norbornene-based resin.

5. The laminate according to claim 1, wherein Re(450) which is an in-plane retardation of the optically anisotropic layer at a wavelength of 450 nm, Re(550) which is an in-plane retardation of the optically anisotropic layer at a wavelength of 550 nm, and Re(650) which is an in-plane retardation of the optically anisotropic layer at a wavelength of 650 nm satisfy a relationship of Re(450)≤Re(550)≤Re(650).

6. An organic electroluminescent device comprising: the laminate according to claim 1.

7. A liquid crystal display device comprising: the laminate according to claim 1.

8. The laminate according to claim 2, further comprising: a polarizer protective film provided between the polarizer and the optically anisotropic layer, wherein a moisture permeability of the polarizer protective film is 50 g/m$^2$·day or less.

9. The laminate according to claim 8, wherein the polarizer protective film contains a norbornene-based resin.

10. The laminate according to claim 2, wherein Re(450) which is an in-plane retardation of the optically anisotropic layer at a wavelength of 450 nm, Re(550) which is an in-plane retardation of the optically anisotropic layer at a wavelength of 550 nm, and Re(650) which is an in-plane retardation of the optically anisotropic layer at a wavelength of 650 nm satisfy a relationship of Re(450)≤Re(550)≤Re(650).

11. An organic electroluminescent device comprising: the laminate according to claim 2.

12. A liquid crystal display device comprising: the laminate according to claim 2.

13. The laminate according to claim 3, wherein Re(450) which is an in-plane retardation of the optically anisotropic layer at a wavelength of 450 nm, Re(550) which is an in-plane retardation of the optically anisotropic layer at a wavelength of 550 nm, and Re(650) which is an in-plane retardation of the optically anisotropic layer at a wavelength of 650 nm satisfy a relationship of Re(450)≤Re(550)≤Re(650).

14. An organic electroluminescent device comprising: the laminate according to claim 3.

* * * * *